United States Patent
Griswold

(10) Patent No.: US 9,869,739 B2
(45) Date of Patent: Jan. 16, 2018

(54) HETERONUCLEAR NUCLEAR MAGNETIC RESONANCE FINGERPRINTING

(71) Applicant: Case Western Reserve University, Cleveland, OH (US)

(72) Inventor: Mark Griswold, Shaker Heights, OH (US)

(73) Assignee: Case Wetern Reserve University, Cleveland, OH (US)

( * ) Notice: Subject to any disclaimer, the term of this patent is extended or adjusted under 35 U.S.C. 154(b) by 1397 days.

(21) Appl. No.: 13/651,690

(22) Filed: Oct. 15, 2012

(65) Prior Publication Data

US 2014/0103924 A1    Apr. 17, 2014

(51) Int. Cl.
*G01R 33/561* (2006.01)
*G01R 33/36* (2006.01)
G01R 33/48 (2006.01)
G01R 33/56 (2006.01)

(52) U.S. Cl.
CPC ....... *G01R 33/561* (2013.01); *G01R 33/3635* (2013.01); *G01R 33/4828* (2013.01); *G01R 33/5605* (2013.01); *G01R 33/5612* (2013.01)

(58) Field of Classification Search
USPC ............................ 324/300–322; 600/407–435
See application file for complete search history.

(56) References Cited

U.S. PATENT DOCUMENTS

| | | | | |
|---|---|---|---|---|
| 6,184,683 | B1 * | 2/2001 | Emsley | G01R 33/4641 324/307 |
| 7,049,074 | B2 * | 5/2006 | Schwartz | C12Q 1/6869 435/6.16 |
| 7,466,127 | B2 * | 12/2008 | Chandrakumar | G01R 33/4633 324/307 |
| 7,598,738 | B2 * | 10/2009 | Kupce | G01N 24/087 324/307 |

(Continued)

FOREIGN PATENT DOCUMENTS

| CN | 1474199 A | 2/2004 |
|---|---|---|
| CN | 101208610 A | 6/2008 |

(Continued)

OTHER PUBLICATIONS

Kozminski, et al., Hecade: HMQC- and HSQC-Based 2D NMR Experiments for Accurate and Sensitive Determination of Heteronuclear Coupling Constants from E.Cosy-Type Cross Peaks, Journal of Magnetic Resonance, 1997, 124:383-392.

(Continued)

*Primary Examiner* — Melissa Koval
*Assistant Examiner* — Tiffany Fetzner
(74) *Attorney, Agent, or Firm* — Quarles & Brady LLP

(57) ABSTRACT

Apparatus, methods, and other embodiments associated with heteronuclear nuclear magnetic resonance fingerprinting (NMRfp) are described. One example apparatus includes individually controllable radio frequency transmission coils configured to apply varying NMRfp RF excitations to a sample. The NMR apparatus may apply excitations in par- (Continued)

allel. The excitations cause different nuclei to produce different signal evolutions. Different pairs of nuclei may produce different signal evolutions depending on quantum correlations between the types of nuclei.

19 Claims, 19 Drawing Sheets

(56) References Cited

U.S. PATENT DOCUMENTS

| | | | | |
|---|---|---|---|---|
| 8,941,381 | B2 * | 1/2015 | Feinberg | G01R 33/4835 |
| | | | | 324/307 |
| 9,002,092 | B2 * | 4/2015 | Madabhushi | G06T 7/0012 |
| | | | | 382/128 |
| 2010/0239143 | A1 | 9/2010 | Griswold et al. | |
| 2011/0018535 | A1 | 1/2011 | Rudakov | |
| 2011/0274626 | A1 | 11/2011 | Duckett et al. | |
| 2012/0029340 | A1 | 2/2012 | Does et al. | |
| 2012/0106821 | A1 * | 5/2012 | Madabhushi | G06T 7/0012 |
| | | | | 382/133 |
| 2012/0235678 | A1 | 9/2012 | Seiberlich et al. | |
| 2014/0103924 | A1 * | 4/2014 | Griswold | G01R 33/3635 |
| | | | | 324/309 |

FOREIGN PATENT DOCUMENTS

| | | | |
|---|---|---|---|
| CN | 101228455 A | 7/2008 | |
| CN | 101896830 A | 11/2010 | |
| EP | WO 2016083166 A1 * | 6/2016 | ............. G01R 33/44 |
| JP | 2006527362 A | 11/2006 | |
| WO | 03019221 A1 | 3/2003 | |

OTHER PUBLICATIONS

Krishnan, et al., Metabolite Fingerprinting and Profiling in Plants Using NMR, Journal of Experimental Botany, 2005, 56(410):255-265.

Ma, et al., MR Fingerprinting (MRF): a Novel Quantitative Approach to MRI, Proc. Intl. Soc. Mag. Reson. Med., 2012, 20:288.

McKenzie, et al., Analysis of Complex Mixtures Using High-Resolution Nuclear Magnetic Resonance Spectroscopy and Chemometrics, Progress in Nuclear Magnetic Resonance Spectroscopy, 2011, 59:336-359.

Pang, et al., Common-Mode Differential-Mode (CMDM) Method for Double-Nuclear MR Signal Excitation and Reception at Ultra-high Fields, IEEE Transactions on Medical Imaging, 2011, 30(11):1965-1973.

PCT International Search Report and Written Opinion, PCT/US2013/060668, dated Dec. 17, 2013.

European Patent Office, Extended European Search Report, Application No. 13847292.3, dated May 12, 2017.

* cited by examiner

RF

HETERONUCLEAR NUCLEAR MAGNETIC RESONANCE FINGERPRINTING

BACKGROUND

Conventional magnetic resonance imaging (MRI) involved repetitively uniformly sampling an object in k-space to acquire, at a pre-determined echo time (TE), a signal associated with a parameter (e.g., T1 relaxation, T2 relaxation, resonant frequency). Conventionally, the signal was associated with one type of nucleus (e.g., $^1$H). Ideally, the signal was constant over a short period of time at or near TE. Conventional MRI relied on assembling many segmented acquisitions into a qualitative image. Obtaining the multiple segmented acquisitions consumed dozens of minutes or more.

Nuclear magnetic resonance (NMR) fingerprinting involved applying a pulse sequence that generated different time courses in tissues with different properties. NMR fingerprinting (NMRfp) excited multiple resonant species at the same time to make different types of tissues generate different signals that could be collected simultaneously and then separated into individual signal evolutions over time. The term "resonant species", as used herein with respect to NMRfp, refers to an item (e.g., water, fat, or other tissue or material) that can be made to resonate using NMR. NMRfp did not define what the signal evolutions for resonant species had to be, Instead, NMRfp captured the signals generated over time and then compared them to other known or modeled signal evolutions or combinations of signal evolutions. Since different tissues or materials have different signal evolutions, multiple parameters (e.g., T1, T2) were able to be determined simultaneously by comparing the signal evolutions acquired over time to the known and/or simulated signal evolutions or combinations of signal evolutions.

More generally, NMRfp involved repetitively, variably sampling an object in (k, t, E) space to acquire a signal evolution (SE) for a single nuclei (e.g., $^1$H) while allowing t and E to vary. K refers to k-space, t refers to time, and E could include T1, T2, D, and other parameters, where D refers to diffusion relaxation. Unlike conventional MRI, NMRfp did not try to have a constant SE, but rather sought an SE that varied over time and that was distinguishable from other SE that were acquired simultaneously, contemporaneously, or within a threshold amount of time. NMRfp produced quantitative estimates of parameters (e.g., T1, T2). While conventional quantification with MRI took dozens of minutes, NMRfp could be performed in less time.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods concern heteronuclear NMRfp where signal evolutions from two or more different types of nuclei can be acquired simultaneously. In one embodiment, heteronuclear NMRfp involves repetitively, variably sampling an object in (k, t, E, n) space to acquire signal evolutions for two or more types of nuclei (e.g., $^1$H, $^{13}$C) with varying t and E. k refers to k-space, t refers to time, E may include resonance frequency, T1, T2, D, and other parameters, and n refers to multiple nuclei. Heteronuclear NMRfp produces quantitative estimates of parameters (e.g., resonance frequency, T1, T2) for multiple different types of nuclei. In one example, the signal evolutions for the two or more types of nuclei may be acquired simultaneously or substantially simultaneously and then compared to stored signal evolutions to characterize the nuclei.

Example apparatus and methods may employ heteronuclear multiple quantum correlations (HMQC) to integrate signals from two or more types of nuclei into a proton-based magnetic resonance fingerprinting (MRF) framework. Example apparatus and methods may, additionally or alternatively, employ heteronuclear single quantum correlations (HSQC) to integrate signals from two or more types of nuclei into the proton-based MRF framework.

There are quantum correlations between certain types of nuclei (e.g., $^1$H & $^{13}$C, $^1$H & $^{14}$N, & $^{15}$N, $^1$H & $^{31}$P, $^1$H & $^{17}$O, $^{13}$C & $^{14}$N, $^{13}$C & $^{31}$P). The quantum correlations allow magnetization to be transferred from one type of nuclei to another type of nuclei and then back via a coherence pathway. These quantum correlations reflect how magnetization in one type of nuclei may affect magnetization in another type of nuclei. Different nuclei may be related (e.g., bonded) in different ways at different times and thus the quantum correlations may be different at different times. These relationships will be described below in association with figures two and three.

Figure 1:
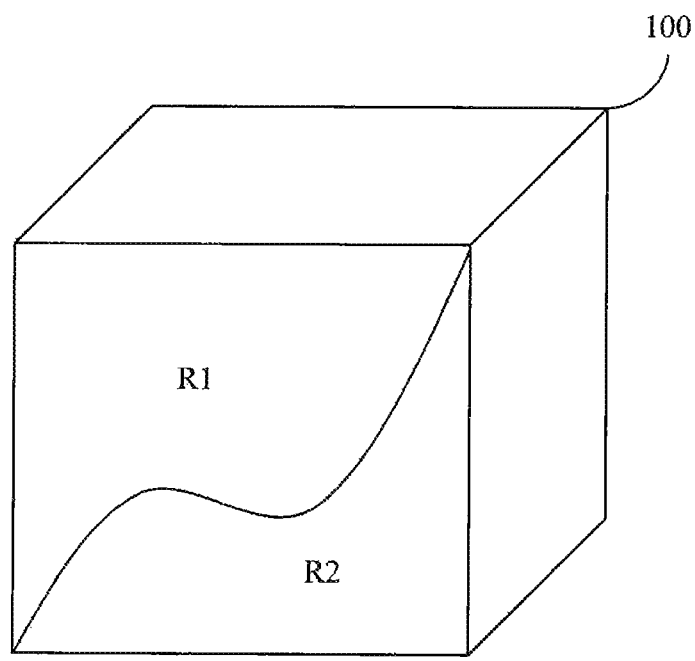
FIG. 1 illustrates a volume that contains two resonant species.

The following provides a brief review of the basics of NMRfp. FIG. 1 illustrates a volume 100 (e.g., voxel) that contains two resonant species R1 and R2. R1 and R2 may have different relaxation or other NMR parameters. For example, the $T1_{R1}$ may be less than $T1_{R2}$ while $T2_{R1}$ may be greater than $T2_{R2}$. T1 refers to longitudinal (spin-lattice) relaxation time and T2 refers to transverse (spin-spin) relaxation time. NMRfp applies radio frequency (RF) energy in a series of varied sequence blocks that cause both R1 and R2 to simultaneously produce different NMR signals. A signal evolution can be produced from these simultaneously produced different NMR signals. Relaxation and other NMR parameters (e.g., T1, T2, PD) (PD=proton density) can be determined from the signal evolution through comparison with other signal evolutions for which relaxation or other NMR parameters are known. The resonant species R1 and R2 can then be characterized by the relaxation or other NMR parameters. Since different tissues have different known relaxation or other NMR parameters, different tissues can be identified using the relaxation or other NMR parameter characterization. While two resonant species are illustrated, one skilled in the art will appreciate that a volume may include a greater or lesser number of resonant species.

Figure 2:
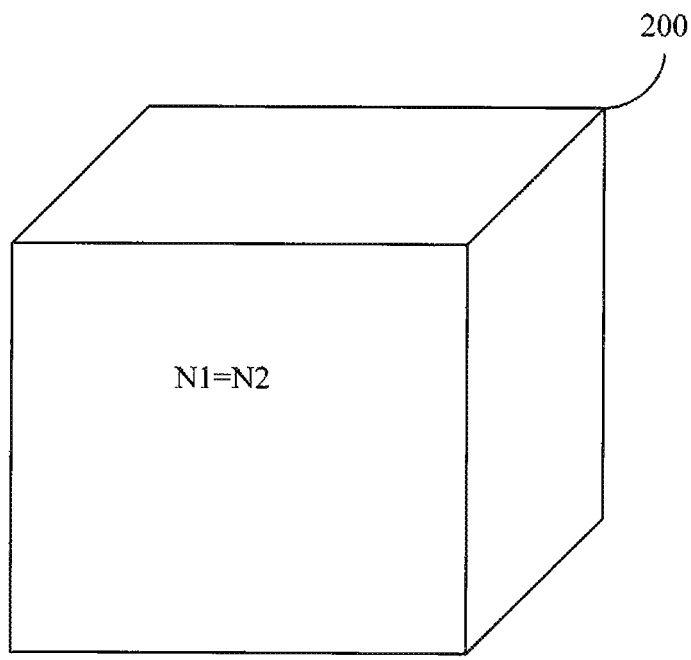
FIG. 2 illustrates a volume that includes two types of nuclei bonded a first way.

Like a volume may contain two different resonant species, a volume may also contain two or more different types of nuclei. FIG. 2 illustrates a volume 200 that includes two different types of nuclei N1 and N2. N1 and N2 are illustrated being coupled directly to each other via a bond. N1 and N2 may be, for example, $^1$H and $^{13}$C. This direct bond coupling may produce a first quantum correlation between N1 and N2. When exposed to an NMRfp RF pulse sequence, N1 and N2 may become excited and produce an NMR signal. When N1 and N2 are capable of transferring magnetization between themselves, and when the NMRfp RF pulse sequence is configured to cause a transfer of magnetization between N1 and N2, then the NMR signals received from volume 200 may depend not only on the presence of N1 and N2 in volume 200, but also on the quantum correlations between N1 and N2 (e.g., bonding, pairing) and on how the transfer of magnetization was produced and controlled by the pulse sequence.

Figure 3:
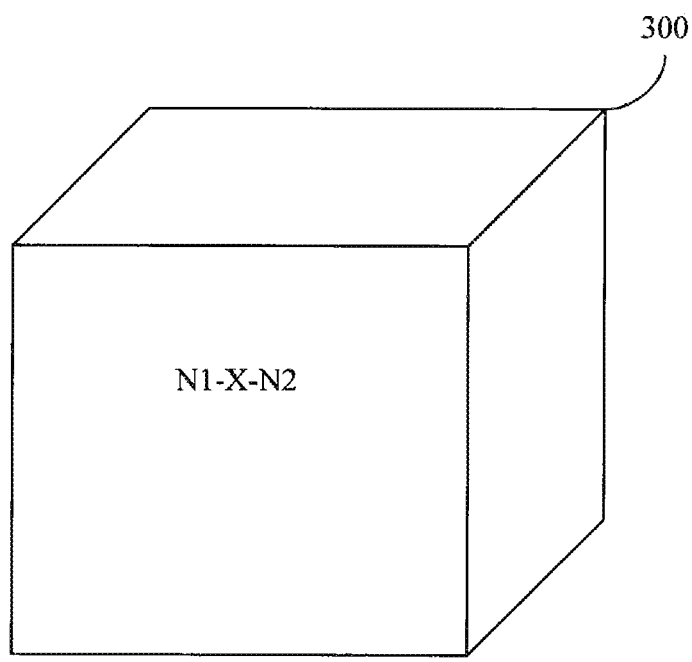
FIG. 3 illustrates a volume that includes two types of nuclei bonded a second, different way.

FIG. 3 illustrates a volume 300 in which N1 and N2 would have a second, different quantum correlation due to the way in which N1 and N2 are associated (e.g., paired, bonded). In volume 300, N1 and N2 are indirectly coupled to each other through bonds to an intermediate item represented generically as X. This indirect single bond coupling may produce a second, different quantum correlation between N1 and N2. When exposed to an NMRfp RE pulse sequence, N1 and N2 may become excited and produce an NMR signal. When N1 and N2 are capable of transferring magnetization between themselves, and when the NMRfp RF pulse sequence is configured to cause a transfer of magnetization between N1 and N2, then the NMR signals received from volume 300 may depend not only on the presence of N1 and N2 in volume 300, but also on the quantum correlations between N1 and N2 and on how the transfer of magnetization was produced and controlled by the pulse sequence. Since N1 and N2 are bonded differently in volume 200 (FIG. 2) and in volume 300 (FIG. 3), the signal evolutions produced in response to exciting N1 and N2 in the two different volumes will be different. Thus, the signal evolutions will be useful not only for detecting the presence of N1 and N2, but also how, if at all, N1 and N2 are bonded.

Figure 4:
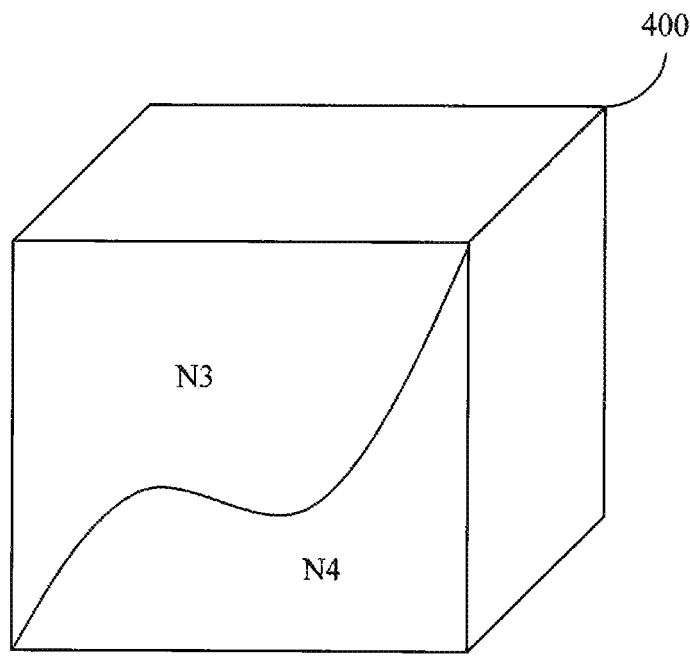
FIG. 4 illustrates a volume that includes two types of nuclei that tend not to associate (e.g., $^1$H, $^{23}$NA).

FIG. 4 illustrates a volume 400 in which N3 and N4 are not bonded. N3 and N4 may be, for example, $^1$H and $^{23}$Na. N3 and N4 do not have a quantum correlation that facilitates transferring magnetization back and forth between the two different types of nuclei. When exposed to an NMRfp RF pulse sequence, N3 and N4 may become excited and produce an NMR signal. When N3 and N4 are not capable of transferring magnetization between themselves, then the NMRfp RF pulse sequence will not cause a transfer of magnetization between N3 and N4. Therefore, the NMR signals received from volume 400 may depend on the presence of N3 and N4 in volume 400, but not on how N3 and N4 are paired (e.g., bonded). Although N3 and N4 may not bond, and may not be capable of transferring magnetization via a quantum correlation pathway, in one embodiment, heteronuclear NMRfp may still be able to simultaneously acquire signal from both types of nuclei.

Like NMRfp was able to simultaneously acquire signals from different resonant species, heteronuclear NMRfp is able to simultaneously acquire signals that are a function of different nuclei or quantum correlations between different nuclei. In one embodiment, a signal evolution for two or more different types of nuclei may be acquired, where the signal evolution is a function of magnetization associated individually with the types of nuclei when the magnetization was not transferred between the two types of nuclei. In another embodiment, the signal evolution may be a function of magnetization associated individually with the two types of nuclei, where the magnetization was transferred between the two types of nuclei. In another embodiment, the signal evolution may be a function of magnetization associated collectively with the pair of nuclei, where the magnetization was transferred between the pair of nuclei.

Figure 5:
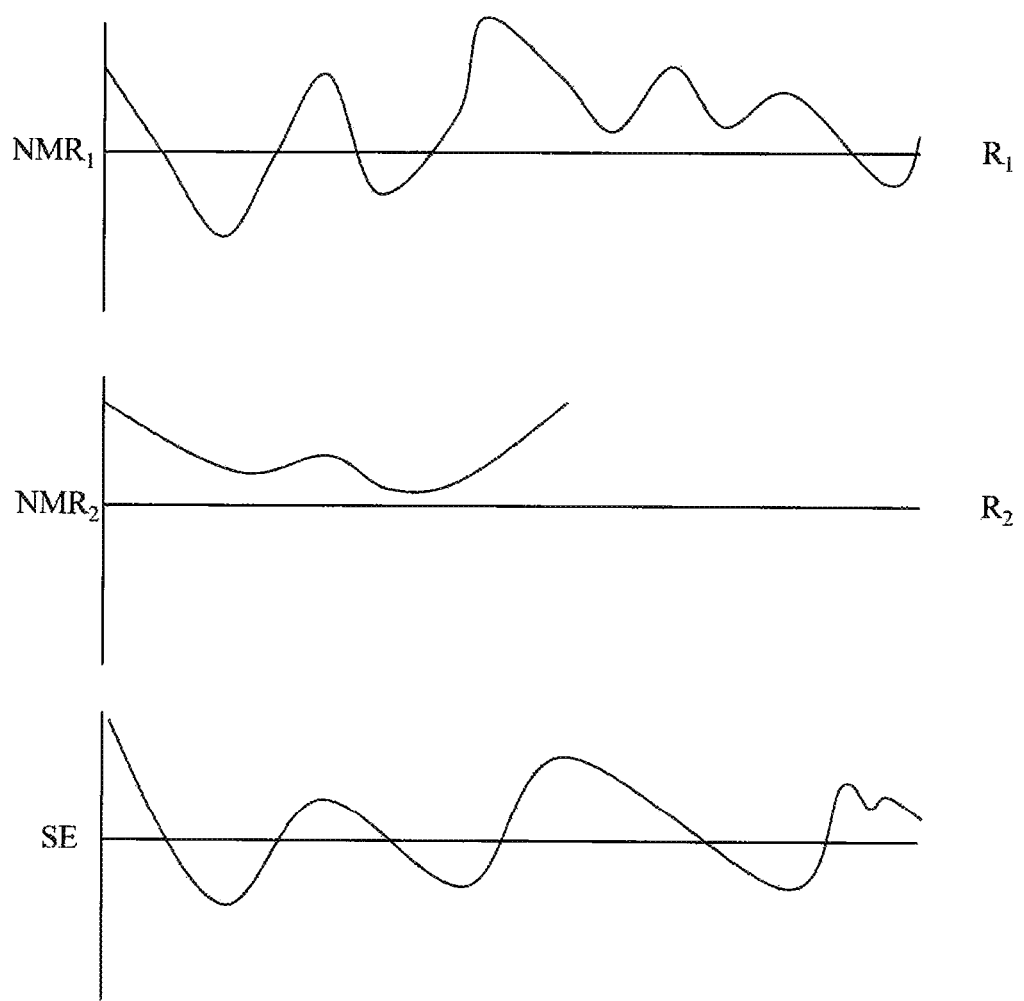
FIG. 5 illustrates two individual NMR signals received from two resonant species and a signal evolution derived from the two individual NMR signals.

Returning now to the review of NMRfp, FIG. 5 illustrates plots of two individual NMR signals: $NMR_1$ and $NMR_2$, that were received from the two resonant species R1 and R2 in volume 100 (FIG. 1). $NMR_1$ includes data points generated by R1 under different conditions at different times. $NMR_2$ includes data points generated by R2 under the different conditions at the different times. The signal evolution (SE) results from $NMR_1$ and $NMR_2$ being generated and acquired simultaneously. The space from which the data points for $NMR_1$ and $NMR_2$ is acquired may be referred to as a (k, t, E) space, where in different examples, E refers to (T1, T2, D), (T1, T2, D, . . . ), (resonance frequency, T1, T2, . . . ) where D refers to diffusion relaxation. In one example, both t and E may be non-linear. In another example, both t and E may be pseudo-random. While two plots associated with two resonant species are illustrated, one skilled in the art will appreciate that a volume may include a greater or lesser number of resonant species and thus may produce a greater or lesser number of signals.

Figure 6:
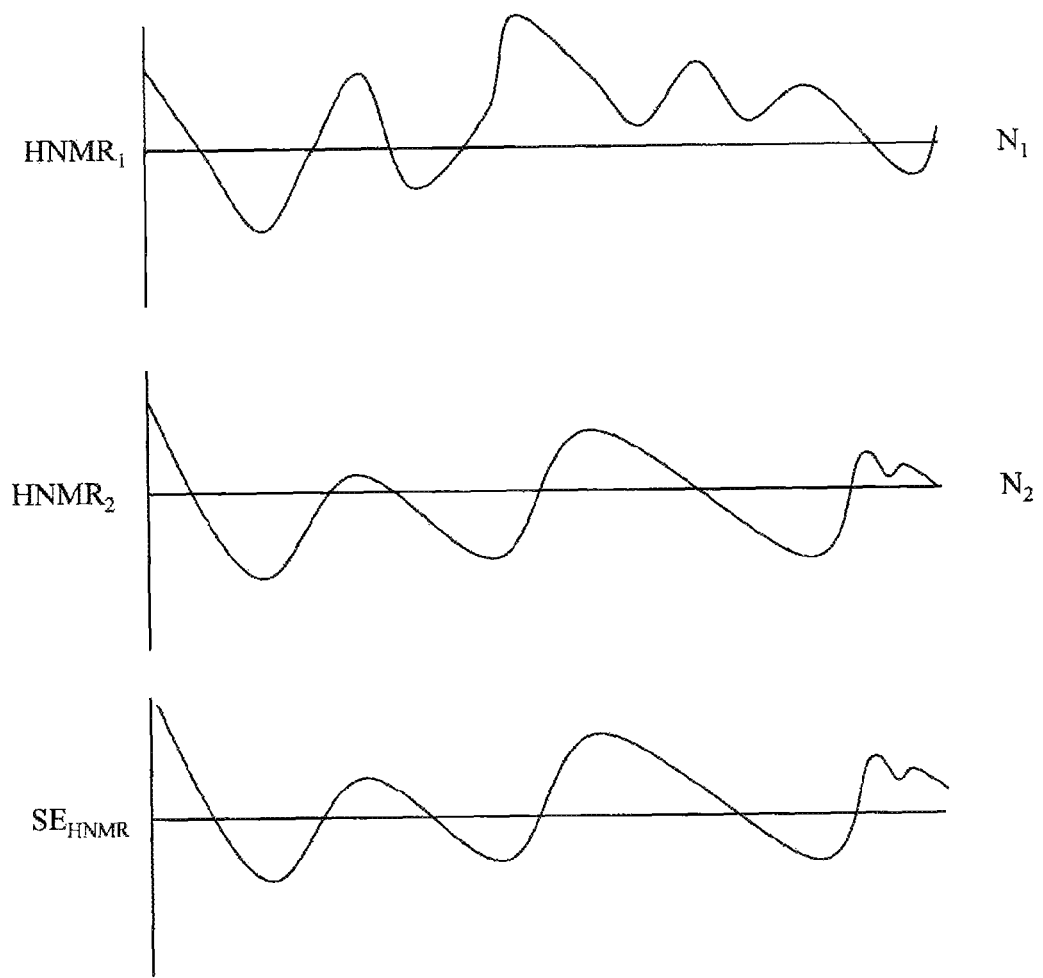
FIG. 6 illustrates two individual NMR signals received from two different nuclei in a volume and a signal evolution derived from the two individual NMR signals.

Turning now to heteronuclear NMR fingerprinting, FIG. 6 illustrates plots of two individual NMR signals: $HNMR_1$ and $HNMR_2$, that were received from the two different types of nuclei N1 and N2 in volumes 200 or 300. $HNMR_1$ includes data points generated by N1 under different conditions at different times. $HNMR_2$ includes data points generated by N2 under the different conditions at the different times. The signal evolution ($SE_{HNMR}$) results from $HNMR_1$ and $HNMR_2$ being generated and acquired simultaneously. The space from which the data points for $HNMR_1$ and $HNMR_2$ is acquired may be referred to as a (k, t, E, n) space, where k refers to k-space, t refers to time, in different examples, E refers to (resonance frequency, T1, T2), (T1, T2, D, . . . ), (T1, T2, . . . ) where D refers to diffusion relaxation, and n refers to nuclei. In one example, both t and E may be non-linear. In another example, both t and E may be pseudo-random. When gradients are not designed and applied in particular ways at particular times, $SE_{HNMR}$ may be a function of the individual magnetization of the different types of nuclei. When particular gradients with particular relationships are designed and applied in particular ways at particular times, then $SE_{HNMR}$ may be a function of the transfer of magnetization between the different types of nuclei.

Figure 7:
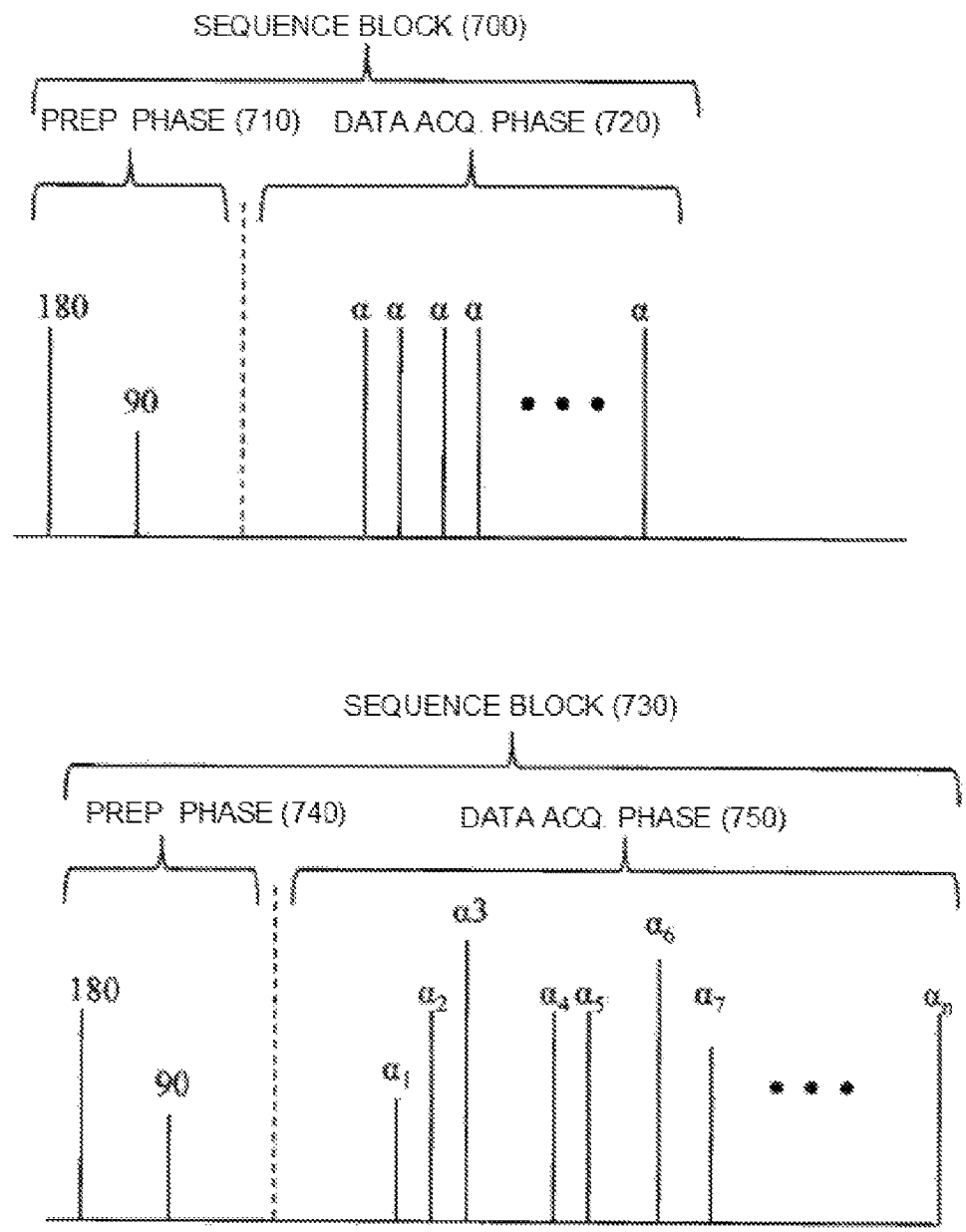
FIG. 7 compares and contrasts conventional MRI sequence blocks to NMRfp sequence blocks.

FIG. 7 compares and contrasts conventional sequence blocks to example NMRfp sequence blocks. Sequence block 700 includes a preparation phase 710 and an acquisition phase 720. During acquisition phase 720, multiple acquisitions using the same flip angle and the same interval between acquisitions may be performed. Acquisition phase 720 resembles approaches that acquire data from a (k, t) space, where t varies either constantly or linearly. The constant variation facilitates acquiring signal with constant amplitude and phase as required for conventional image reconstruction.

Sequence block 730 also includes a phase 740 and an acquisition phase 750. Notice that acquisition phase 750 is longer than acquisition phase 720. Unlike acquisition phase 720 where parameters are either fixed or vary linearly, in acquisition phase 750 the parameters may vary, either non-linearly, randomly, or pseudo-randomly. Parameters that may vary include, but are not limited to, echo time, flip angle, phase encoding, delay time, and others. Note also that while phase 740 may, in some examples, be a preparation phase or preparation-like phase, that phase 740 does not necessarily perform a conventional image-centric preparation. While FIG. 7 illustrates pulse sequences associated with NMRfp, FIGS. 15-19 illustrates sets of pulse sequences that may be used in heteronuclear NMRfp. The individual pulse sequences illustrated in FIGS. 15-19 may be similar, for example, to sequence 730.

Figure 8:
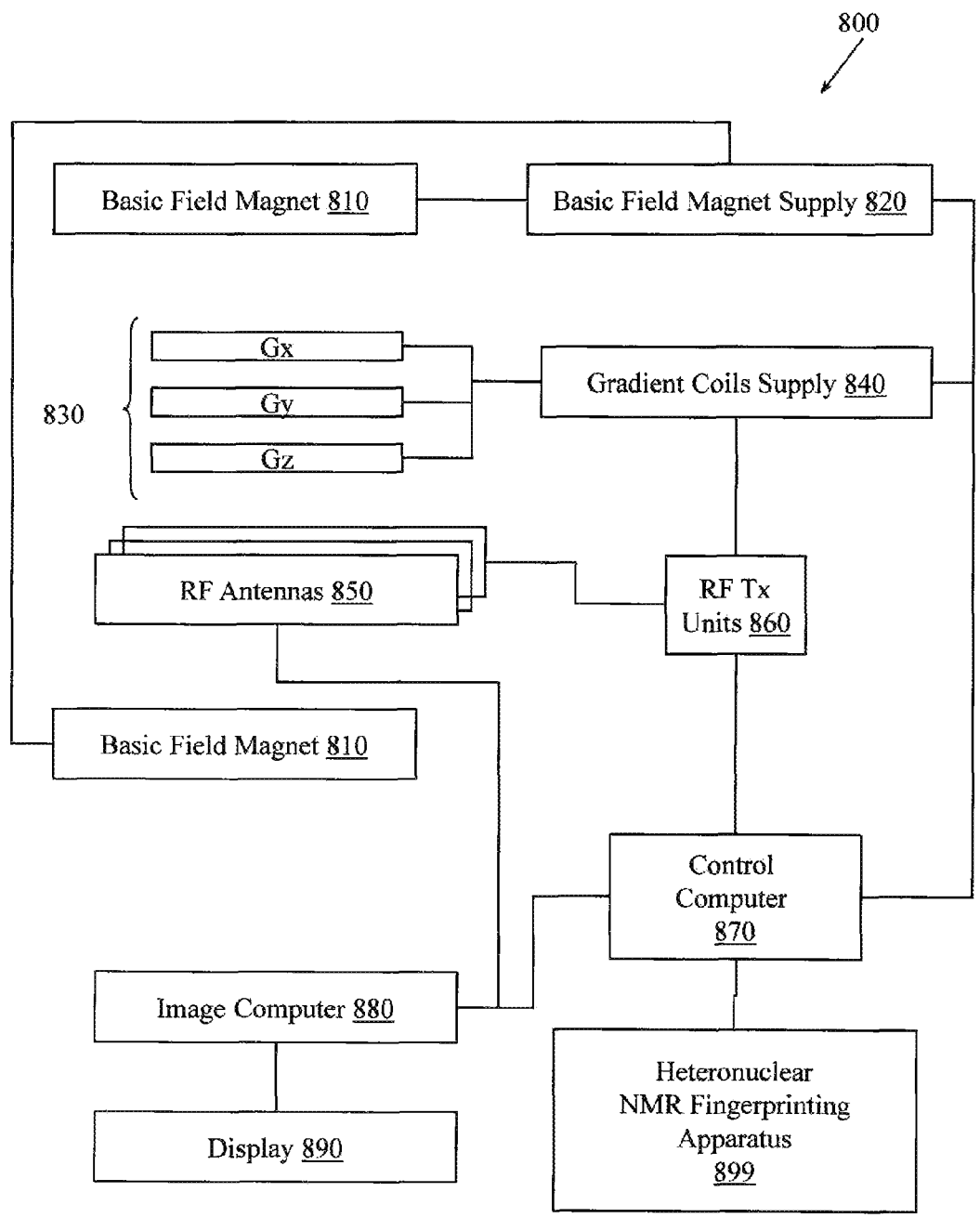
FIG. 8 illustrates an MRI apparatus configured to perform heteronuclear NMRfp.

FIG. 8 illustrates an example MRI apparatus 800 configured with an apparatus 899 to control heteronuclear NMRfp. The apparatus 899 may be configured with elements of example apparatus described herein and/or may perform example methods described herein. In one embodiment, apparatus 899 may be configured to control NMR apparatus 800 to apply RF energy suitable to produce concurrent nuclear magnetic resonance in two or more different types of nuclei in a volume. The two or more different types of nuclei may or may not share a quantum correlation. The NMR apparatus 800 is controlled to apply the RF energy in at least two different sequence blocks that differ in at least two or more of, the number of α2 pulses, the amplitude of α2 pulses, the phase of α2 pulses, and the spacing between α2 pulses. Apparatus 899 may be configured to control apparatus 800 to determine two or more relaxation or other NMR parameters for the two or more different types of nuclei by comparing NMR signals acquired from the volume to characterized signal evolutions or combinations of signal evolutions.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$ or Gx, Gy, and Gz. The gradient coils 830 may be controlled, at least in part, by a gradient coils supply 840. In some examples, the timing, strength, and orientation of the gradient magnetic fields may be controlled, and thus selectively adapted, during an MRI procedure.

MRI apparatus 800 may include a set of RF antennas 850 that are configured to generate RF pulses and to receive resulting NMR signals from an object to which the RF pulses are directed. In one embodiment, the RF antennas 850 are arranged as an array of parallel transmission coils that are individually controllable. How the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RE antenna 850. The RF transmission unit 860 may provide different signals to different RF antennas to produce different RF excitations from the different members of the array of parallel transmission coils. In one example, the different RF excitations may have different flip angles and different TRs.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890. However, heteronuclear NMRfp apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, heteronuclear NMRfp apparatus 899 facilitates the comparison of received signals to known signals for which a reconstruction, relaxation parameter, NMR parameter, or other information is already available. This facilitates producing a quantitative result.

While FIG. 8 illustrates an example MRI apparatus 800 that includes various components connected in various ways, it is to be appreciated that other MRI apparatus may include other components connected in other ways.

Figure 9:
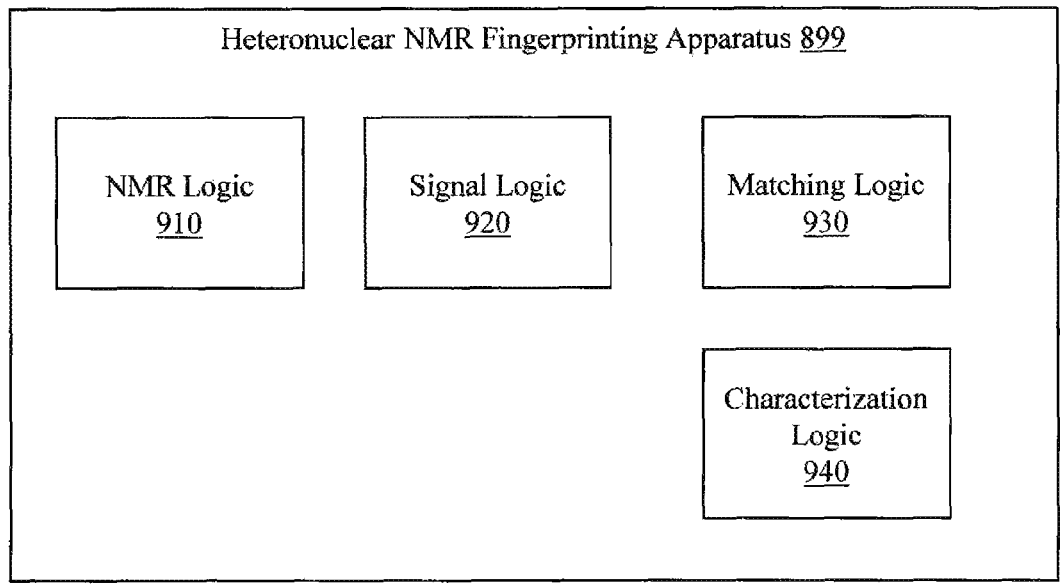
FIG. 9 illustrates an apparatus configured to perform heteronuclear NMRfp.

FIG. 9 illustrates an embodiment of heteronuclear NMRfp apparatus 899. In one embodiment, apparatus 899 includes an NMR logic 910. NMR logic 910 is configured to repetitively and variably sample an object in a (k, t, E, n) space to acquire a set of NMR signals that may have non-constant amplitude and/or phase. The object may include multiple types of nuclei. The nuclei may be nuclei that have quantum correlations and that can exchange magnetization or may be nuclei that do not have quantum correlations and therefore cannot exchange magnetization. Nuclei that can exchange magnetization may be paired in different ways. For example, at one time, two types of nuclei may be directly bonded while at another time two types of nuclei may be indirectly bonded through bonds with a third type of nuclei. Sampling may include presenting RF in configurations designed to excite different types of nuclei and to selectively cause transfer of magnetization.

Members of the set of NMR signals are associated with different points in the (k, t, E, n) space. In different embodiments the different points are sampled according to a plan where t and/or E varies non-linearly and/or in a non-constant manner. In one embodiment, NMR logic 910 is configured to acquire NMR signals that were produced in response to different excitations produced in different members of an array of parallel TX coils. The array may be referred to as a pTx array. This pTx array may contain multiple coils tuned for excitation of a single nuclei, or may contain different coils tuned to different nuclei or a combination containing multiple coils that can excite multiple nuclei. The NMR signals may be associated with two or more nuclei.

NMR apparatus 899 also includes a signal logic 920. Signal logic 920 is configured to produce an NMR signal evolution from the NMR signals. The signal evolution may include a number of NMR signals acquired over a period of time. Unlike conventional systems where NMR signals from different signal producing regions may be similar, signal logic 920 may process NMR signal evolutions that are more de-correlated. Thus, in one example, apparatus 899 may include multiple signal logics 920. Different signal logics may be configured to process signal from different signal producing regions or from different signal producing nuclei. In one embodiment, the multiple signal logics 920 may be configured to operate in parallel.

NMR apparatus 899 also includes a matching logic 930. Matching logic 930 is configured to compare produced NMR signal evolutions to known NMR signal evolutions. The known NMR signal evolutions may be, for example, previously acquired signal evolutions, simulated signal evolutions, or combinations of simulated evolutions or combinations of measured evolutions. Like apparatus 899 may include multiple signal logics 920, apparatus 899 may also include multiple matching logics 930. The multiple matching logics 930 may be configured to operate in parallel.

Apparatus 899 may also include a characterization logic 940. In one embodiment, characterization logic 940 is configured to characterize nuclei, pairs of nuclei, or quantum correlations between nuclei in the object. The characterizing may include comparing the NMR signal evolution(s) to a characterizing signal evolution(s). Characterizing the nuclei may include identifying parameters including, but not limited to, T1 relaxation, T2 relaxation, diffusion weighted relaxation, and resonance frequency. Characterizing the nuclei can include identifying the presence of nuclei and additional information concerning the presence of a paired nuclei and a quantum correlation (e.g., pairing, bonding) between the nuclei. The characterizing signal evolution(s) may be stored in a library of characterizing signal evolutions. In one embodiment, the library is configured to directly store the signal evolutions. In another embodiment, the library is configured to store a transformed or compressed representation of the full library of signal evolutions. In one embodiment, characterization logic 940 may be configured to characterize information received from different nuclei.

Conventional MRI used precise preparation times to create precise preparation conditions that facilitated acquiring signals from a single type of nuclei from a series of precisely defined locations on a projection path (e.g., Cartesian, radial) at short precise points in time to make imprecise qualitative images.

NMRfp took a different approach NMRfp chose to sample (k, t, E) space. Instead of acquiring signal voxel by voxel, slice by slice, or characteristic by characteristic, NMRfp facilitated analyzing N characteristics in M voxels at the same time, N and M being numbers. Also unlike conventional MRI, NMRfp facilitated acquiring useful signal for a longer period of time, rather than during an instantaneous period of time associated with a specified echo time (TE). Heteronuclear NMRfp extends this approach to acquiring signal from two or more different types of nuclei during the same acquisition period in response to coordinated series of NMRfp pulse sequences. Additionally, heteronuclear NMRfp facilitates acquiring relationship data. The relationship data may facilitate identifying how nuclei are currently paired in a sample.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 10:
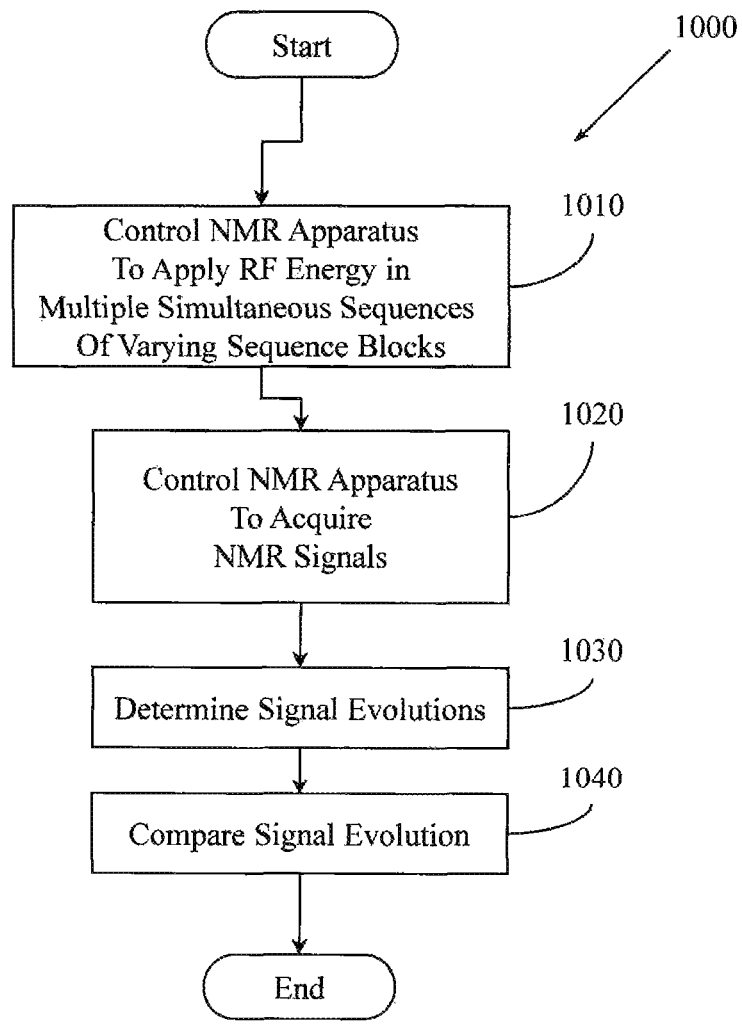
FIG. 10 illustrates an example method configured to perform heteronuclear NMRfp.

FIG. 10 illustrates a method 1000 associated with heteronuclear NMRfp. Method 1000 includes, at 1010, controlling an NMR apparatus to apply RF energy to a volume in an object. The volume may contain one or more types of nuclei. Unlike conventional NMR systems, or even conventional NMRfp systems, controlling the NMR apparatus may include applying RF energy in multiple coordinated (e.g., paired, simultaneous, parallel) sequences of NMRfp varying sequence blocks. Also unlike conventional systems, controlling the NMR apparatus at 1010 may include controlling different members of a parallel transmission (pTx) array to apply different RF energy excitations. The different RF energy excitations may vary in ways including, but not limited to, target nuclei, amplitude, phase, frequency, flip angle, and delay time. In one embodiment, varying the flip angles in different RF excitations in different members of the set of TX coils can produce flip angle distributions throughout the volume, which in turn may produce locally varying conditions. Various types of multiple simultaneous sequences of varying sequence blocks are illustrated in FIGS. 15-19.

In one embodiment, method 1000 involves controlling an NMR apparatus configured with two or more individually controllable transmit (TX) coils. Method 1000 controls the NMR apparatus to apply a first NMRfp RF excitation from a first of the two or more TX coils to a sample and to apply a second, different NMRfp RE excitation from a second of the two or more TX coils to the sample. In one embodiment, the two different NMR RF excitations are applied at the same time from the different coils. In one example, the first NMRfp RF excitation and the second NMRfp RF excitation may be configured to produce a spatial inhomogeneity in a sample to which the first NMRfp RF excitation and the second NMRfp RF excitation are applied. In another example, the two coils may preferentially excite different nuclei. The sample may be, for example, a human, an animal, or other object. The sample may include one or more different types of nuclei. In one example, the spatial inhomogeneity is configured to facilitate de-correlating signal evolutions from different signal generating regions in the sample.

Method 1000 may include controlling the NMR apparatus to make one of the simultaneous sequences of varying sequence blocks differ from another of the simultaneous sequences of varying sequence blocks in one or more of, target nuclei, amplitude, phase, frequency, delay time, and flip angle. Method 1000 may include controlling the NMR apparatus to make the first NMRfp RF excitation and the second NMRfp RE excitation differ in an amount effective to change contrast in the sample from sequence block to sequence block or from location to location.

The RF energy applied from a member of the pTx array of coils may be applied in a series of variable sequence blocks. Sequence blocks may vary in a number of parameters including, but not limited to, target nuclei, echo time, flip angle, phase encoding, diffusion encoding, flow encoding, RF pulse amplitude, RE pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, and A3 may differ from A4 in two parameters. In one example, the only difference between consecutive sequence blocks may be the number of $\alpha 2$ pulses.

Controlling the NMR apparatus at 1010 to apply different RF energy excitations through different members of the pTx array may include varying parameters for a single coil over time and may also include varying parameters between coils over time. Thus example apparatus and methods may vary parameters in two dimensions: through time for a single coil, and spatially between coils. By way of illustration a first coil TX1 may produce a series of RF excitations TX1RF1, TX1RF2, TX1RFn at times T1, T2, . . . Tn. A second coil TX2 may also produce a series of excitations TX2RF1, TX2RF2, . . . TX2RFn. The signals from TX1 may vary amongst themselves (e.g., TX1RF1≠TX1RF2). Similarly, the signals from TX2 may vary amongst themselves (e.g., TX2RF1≠TX2RF2). Additionally, the signals may vary between coils (e.g., TX1RF1≠TX2RF1).

The RF energy applied during the multiple simultaneous series of sequence blocks may be configured to cause different individual types of nuclei to simultaneously produce individual NMR signals. The RF energy applied during the multiple simultaneous series of sequence blocks may be configured to cause a transfer of magnetization between individual types of nuclei and thus to produce a signal evolution that is a function of magnetization transfer. At least one member of the series of variable sequence blocks will differ from at least one other member of the series of variable sequence blocks in at least N sequence block parameters, N being an integer greater than one. Additionally, in one embodiment, at least one RF TX coil will deliver an RF excitation that differs from the RF excitation delivered by a different RF TX coil in the parallel array of transmission coils in at least M parameters. In different embodiments N may be a number greater than one. Similarly, in different embodiments, M may be a number greater than one. The signal content of a signal evolution may vary directly with N and M. Thus, as more parameters are varied, a potentially richer signal is retrieved. Additionally, as more pTx coils deliver different RF excitations, signals that potentially may be more able to be de-correlated can be produced.

In one embodiment, the NMR apparatus may be controlled at 1010 to apply members of the series of variable sequence blocks according to a partially random acquisition plan configured to under-sample the object at an under-sampling rate R. In different embodiments, rate R may be, for example, two, four, or even larger numbers.

Method 1000 also includes, at 1020, controlling the NMR apparatus to acquire the NMR signals produced in response to applying the RF energy. The NMR apparatus can be controlled to acquire signal for various lengths of time including, for example, up to ten seconds, up to twenty seconds, up to one hundred seconds, or for even longer. NMR signals can be acquired for longer periods of time because signal information content remains viable for longer periods of time in response to the series of varied RF energy applied at 1010.

Method 1000 also includes, at 1030, controlling the NMR apparatus to determine a signal evolution from the acquired NMR signals. Determining the signal evolution may include storing (k, t, E, n) space data points acquired during action 1020. While an individual sequence block may yield a single point in (k, t, E, n) space, the signal evolution is determined by the series of variable sequence blocks. Over time, series of variable sequence blocks that yield useful signal evolutions may be identified. Determining the signal evolution at 1030 for a first signal producing region may include treating a signal from a second signal producing region as noise in a first signal producing region. Treating the signal as noise is facilitated when the two signals are more orthogonal and thus can be de-correlated. The degree of orthogonality may vary directly with the number of parameters varied per sequence block and may also vary directly with the number of different RF excitations produced by different members of the parallel array of transmission coils. Alternatively, the determination of the signal evolution could involve modeling all or a portion of a signal from a second signal producing region as a combination of one or more stored signal evolutions.

Method 1000 also includes, at 1040, controlling the NMR apparatus to compare the signal evolution to one or more known, stored, simulated, reference, or predicted signal evolutions or a combination of known signal evolutions. In different examples, the "stored" or "known" signal evolutions may include previously acquired signals, simulated signals, or both. In one embodiment, the stored signal evolutions are associated with signals not acquired from the object while in another embodiment the stored signal evolutions are associated with signals acquired from the object. Different signal evolutions may be analyzed to determine not only the presence of different types of nuclei, but also a quantum relationship (e.g., bonding, pairing) between pairs or sets of nuclei, and a magnetization transfer between types of nuclei.

The stored signals may be associated with a potentially very large data space. Thus, one skilled in the art will appreciate that the stored signal evolutions may include signals outside the set of signal evolutions characterized by:

$$SE = A - Be^{-t/C} \quad [1]$$

Indeed, one skilled in the art will appreciate that the very large data space for the stored signal evolutions can be partially described by:

$$SE = \Pi_{i=1}^{NA} \Sigma_{j=1}^{NRF} R_i(\alpha) R_{RF_{ij}}(\alpha,\varphi) R(G,f) E_i(T1,T2,D,f) \quad [2]$$

where:
SE is a signal evolution,
$N_A$ is a number of sequence blocks,
$N_{RF}$ is a number of RF pulses in a sequence block,
$\alpha$ is a flip angle,
$\varphi$ is a phase angle,
$R_i(\alpha)$ is a rotation due to off resonance,
$R_{RF_{ij}}(\alpha,\varphi)$ is a rotation due to RF differences,
$R(G,f)$ is a rotation due to a gradient or resonance frequency f
T1 is spin-lattice relaxation,
T2 is spin-spin relaxation,
D is diffusion relaxation, and
$E_i(T1,T2,D,f)$ is decay due to relaxation differences.

While $E_i(T1,T2,D,f)$ is provided as an example, one skilled in the art will appreciate that in different embodiments, $E_i(T1,T2,D,f)$ may actually be $E_i(T1,T2,D, \ldots )$, or $E_i(T1,T2, \ldots )$.

In one example, the summation on j could be replaced by a product on j, e.g.:

$$SE = \Pi_{i=1}^{NA} \Pi_{j=1}^{NRF} R_i(\alpha) R_{RF_{ij}}(\alpha,\varphi) R(G,f) E_i(T1,T2,D,f) \quad [3]$$

In NMR, MRI, or ESR (electron spin resonance), a Bloch equation is a member of a set of macroscopic equations that are used to calculate the nuclear magnetization $M=(M_x, M_y, M_z)$ as a function of time when relaxation times $T_1$ and $T_2$ are present. These phenomenological equations were introduced by Felix Bloch and may also be referred to as the equations of motion of nuclear magnetization. One skilled in the art will appreciate that in one embodiment $R_i(\alpha)$, $R_{RF_{ij}}(\alpha,\varphi)$, and $R(G,f)$ may be viewed as Bloch equations.

While FIG. 10 illustrates various actions occurring in serial, it is to be appreciated that various actions illustrated in FIG. 10 could occur substantially in parallel. By way of illustration, a first process could control applying RF energy, a second process could control acquiring NMR signals and determining a signal evolution, and a third process could perform signal evolution comparisons. While three processes are described, it is to be appreciated that a greater and/or lesser number of processes could be employed.

Figure 11:
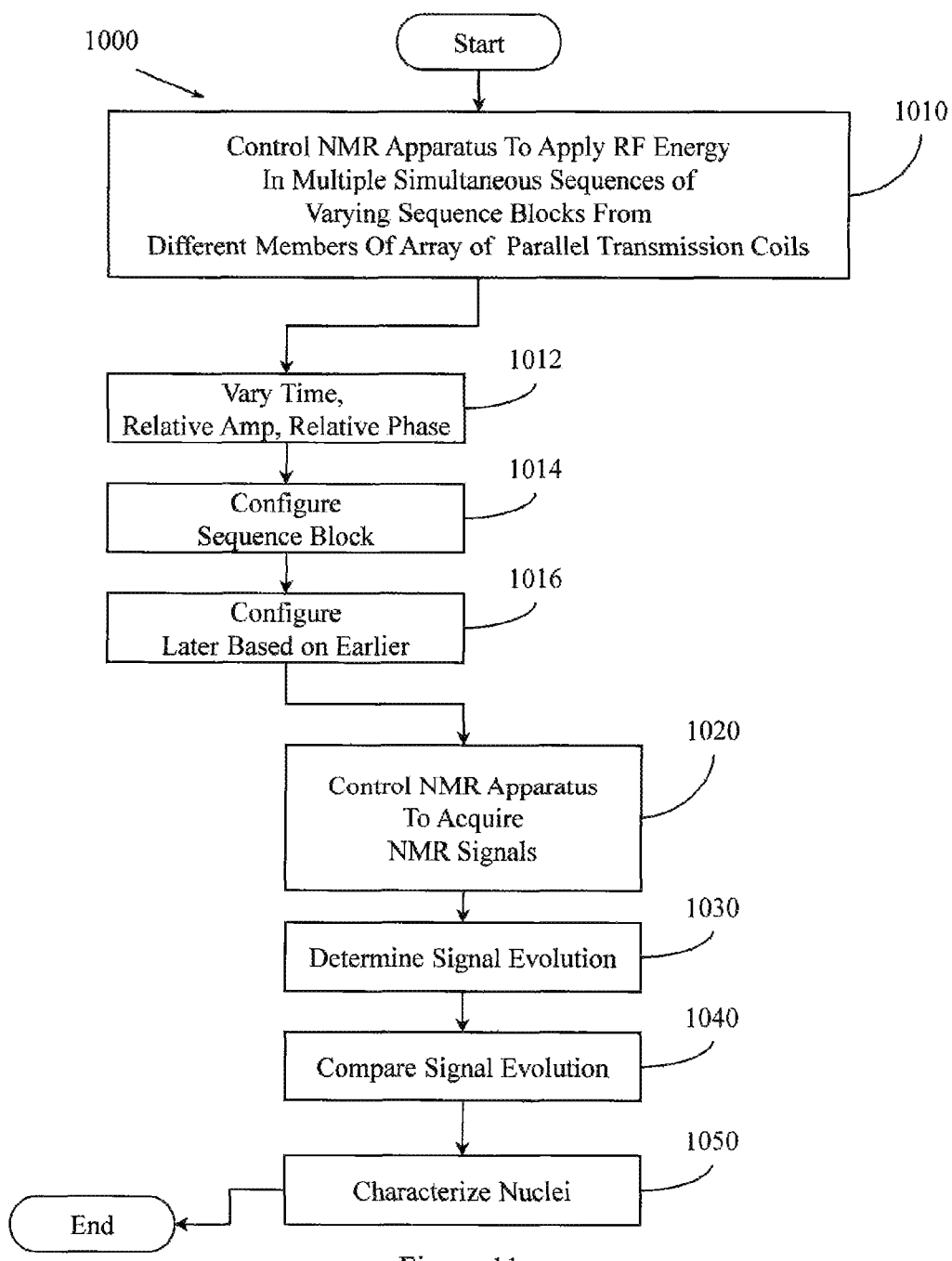
FIG. 11 illustrates an example method configured to perform heteronuclear NMRfp.

FIG. 11 illustrates another embodiment of method 1000 (FIG. 10). This embodiment includes actions 1010, 1020, 1030, and 1040. However, this embodiment also includes actions 1012, 1014, 1016, and 1050.

This embodiment of method 1000 includes, at 1012, controlling the NMR apparatus to vary one or more of, the amount of time between sequence blocks, the relative amplitude of sequence blocks, and the relative phase of sequence blocks. The sequence blocks can be varied amongst members of the pTx array that are transmitting in parallel. The sequence blocks can also be varied within a single member of the pTx array. Thus, not only can the individual parameters (e.g., flip angle, phase) be varied between sequence blocks, but the times between sequence blocks and other differences between sequence blocks can be varied both in a single coil and between coils. This facilitates creating additional signal content in the signal evolution.

The varying at 1012 may be coordinated between members of the parallel array of transmission coils. In one example, sequences may cycle around members of the parallel array of transmission coils. For example, a first sequence applied at a first time through a first TX coil may be the second sequence applied at a second time through a second TX coil. Other combinations are possible.

This embodiment of method 1000 also includes, at 1014, controlling the NMR apparatus to configure a member of the series of variable sequence blocks as one of, a TrueFISP pulse sequence, a FLASH pulse sequence, and a turbo spin echo (TSE) pulse sequence. Action 1014 illustrates that a set of sequence blocks is not necessarily the same thing as a conventional imaging-based pulse sequence. A sequence block differs from a conventional pulse sequence for at least the reason that non-linearly varying Δt and ΔE, which produce NMR signals in (k, t, E, n) space having non-constant amplitudes and phases are encouraged, not prohibited. Additionally, applying different variable sequence blocks from different TX coils is encouraged.

This embodiment of method 1000 also includes, at 1016, controlling the NMR apparatus to configure a later member of the series of variable sequence blocks based, at least in part, on an NMR signal acquired in response to applying an earlier member of the series of variable sequence blocks. Thus, this embodiment of method 1000 is an adaptive method where the order of members of the series of varied sequence blocks may not be known ahead of time. Instead, as data points in (k, t, E, n) space are acquired, and as a signal evolves, decisions concerning different sequence blocks and different sets of parameters to vary may be made. The decision may control the sequence blocks that are produced by different members of the array of transmission coils. By way of illustration, a first number of data points in (k, t, E, n) space and an evolving signal may be leading towards one relaxation or other NMR parameter determination and away from another relaxation or NMR parameter determination. Therefore, sets of sequence blocks that can confirm and/or reject either of these leads may be applied next in the set of series to facilitate a guided and more rapid convergence in the comparison and analysis process.

This embodiment of method 1000 also includes, at 1050, controlling the NMR apparatus to characterize nuclei as a function of comparing the signal evolution(s) to one or more reference (e.g., stored, known, simulated, predicted, combined, reduced) signal evolutions. Comparing the acquired signal evolution to another signal evolution may include, for example, controlling the NMR apparatus to compare the signal evolution to members of a multi-dimensional set of NMR signal evolutions. A first dimension in the multi-dimensional set may be associated with a first set of sequence block parameters and a second dimension in the multi-dimensional set may be associated with a second, different set of sequence block parameters. Since a signal evolution evolves over time, the multi-dimensional set may include a time dimension and the pattern matching process may include a path matching process that monitors the progress of the signal evolution. Additionally, since one series of varied sequence blocks may differ from another series of varied sequence blocks, the multi-dimensional set may include an order dimension where once again the pattern matching process may path match as opposed to just pattern matching.

Characterizing types of nuclei may include, for example, identifying relaxation parameters or other NMR parameters including, but not limited to, T1 relaxation associated with the nuclei, T2 relaxation associated with the nuclei, off-resonance relaxation associated with the nuclei, diffusion weighted relaxation associated with the nuclei, and the effects, if any, of quantum correlations between nuclei.

Figure 12:
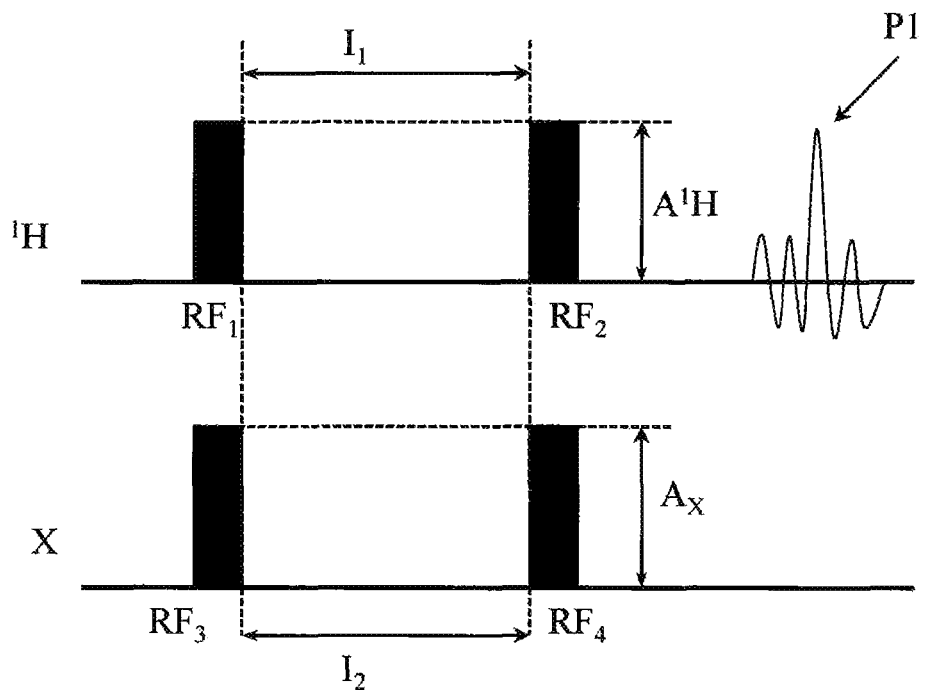
FIG. 12 illustrates pulse sequences associated with a heteronuclear multiple quantum correlations (HMQC) process.

FIG. 12 illustrates pulse sequences associated with a heteronuclear multiple quantum correlations (HMQC) process. RF pulses $RF_1$ and $RF_2$ are applied in order to excite a first type of nuclei (e.g., $^1H$) while RF pulses $RF_3$ and $RF_4$ are applied in order and simultaneously to excite a second type of nuclei generally referred to as X. $RF_1$, $RF_2$, $RF_3$, and $RF_4$ may have a common amplitude (e.g., $A_{1H}=A_X$). $RF_1$ and $RF_3$ are applied at the same time, and $RF_2$ and $RF_4$ (e.g., interval $I_1$=interval $I_2$) are applied at the same time. When exposed to RF in this manner during an example HMQC approach, the maximal transfer of coherence occurs at a single readout point P1. In this approach, the signal received at P1 may be a function of magnetization associated collectively with $^1H$ and with X. $RF_1$, $RF_2$, $RF_3$, and $RF_4$ are illustrated as boxes. The boxes represent RF pulses that may have different shapes including, but not limited to, rectangular, sinc, Gaussian, and hyperbolic.

Figure 13:
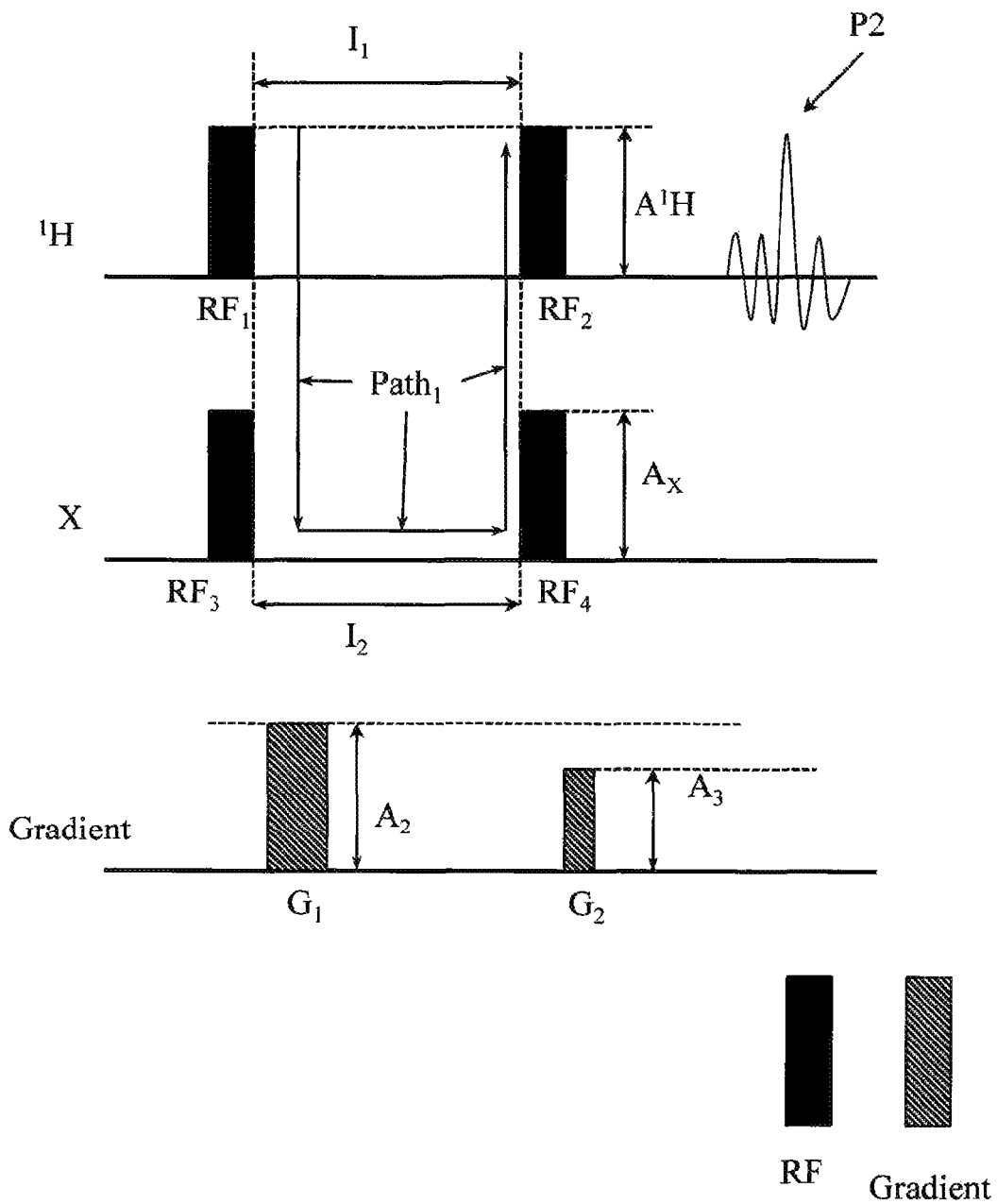
FIG. 13 illustrates pulse sequences associated with an HMQC process that also includes gradients.

FIG. 13 illustrates pulse sequences associated with an HMQC process that also applies gradients and that therefore produces a different type of signal at P2. In addition to applying $RF_1$, $RF_2$, $RF_3$, and $RF_4$, gradients $G_1$ and $G_2$ are applied. $G_1$ is applied in between the application of $RF_1$ and $RF_2$ and $G_2$ is applied after the application of $RF_2$. Applying $G_2$ after the application of $RF_2$ may involve applying $G_2$ before a subsequent (not illustrated) RF pulse is applied. $G_1$ and $G_2$ may have different properties. For example, the amplitude $A_2$ of $G_1$ may not be the same as the amplitude $A_3$ of $G_2$. $G_1$ and $G_2$ are illustrated as boxes. The boxes represent non-uniform magnetic fields that may have different forms in time or space. The different forms include, but are not limited to, rectangular, quadratic, Gaussian, and hyperbolic. The boxes may be referred to as gradients. Like FIG. 12, the process illustrated in FIG. 13 will produce a maximal transfer of coherence at a single readout point P2 in the sequence. However, unlike FIG. 12, the signal produced at P2 would be a function only of magnetization that was transferred from $^1H$ to X and then back again along path $Path_1$.

Since the way that $^1H$ and X are coupled, bonded, associated, or otherwise related affects the quantum correlation between $^1H$ and X, the signal acquired at P2 provides information over and above just the mere presence of $^1H$ and X in the volume. The signal acquired at P2 also provides information about how, if at all, $^1H$ and X are currently associated (e.g., bonded, paired, quantum correlated) in the volume.

Heteronuclear NMRfp, like NMRfp, relies less on a single readout point and more on longer, continuous sampling. Therefore, in one embodiment, heteronuclear NMRfp applies RF and gradients to produce a randomized transfer of signal back and forth between resonant states to facilitate more continuous sampling of coherence over the course of multiple readout periods rather than only seeking one echo at a point like P1 or P2. In another embodiment, heteronuclear NMRfp applies RF and gradients to produce individual signals from individual nuclei where those individual signals can be acquired as a signal evolution in (k, t, E, n) space.

Figure 14:
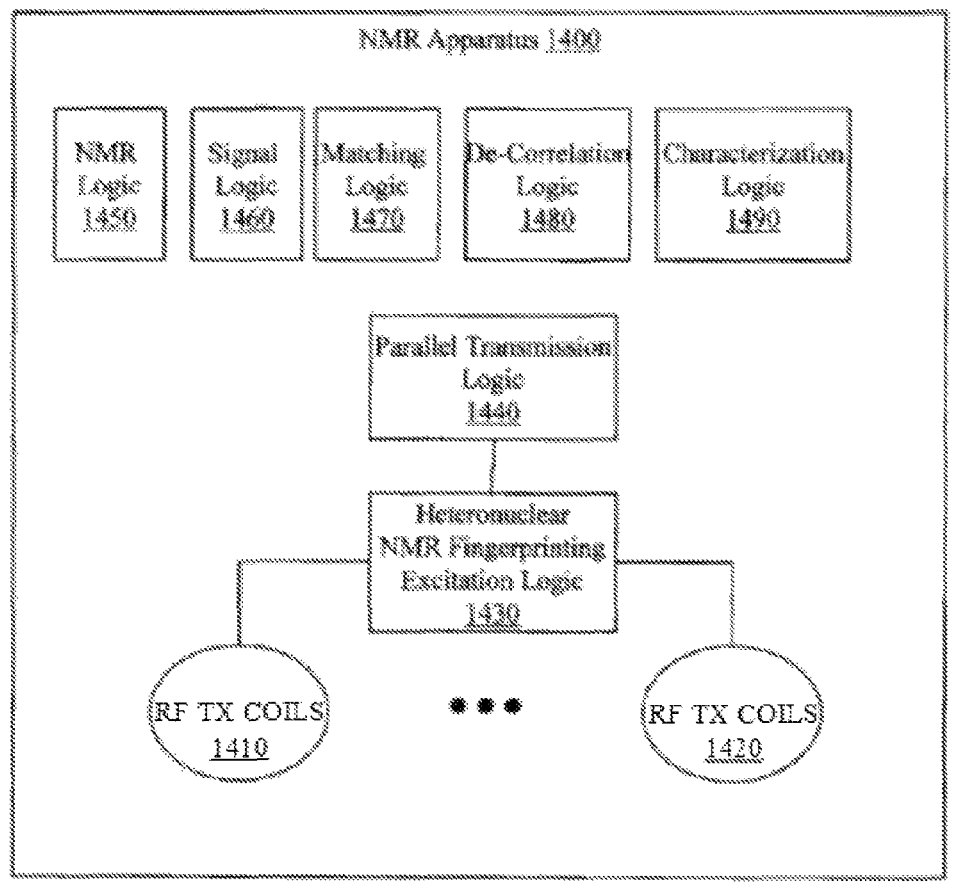
FIG. 14 illustrates an example apparatus associated with multi-nuclear NMRfp.

FIG. 14 illustrates an apparatus 1400 associated with heteronuclear NMRfp. Apparatus 1400 includes at least two individually controllable radio frequency (RF) transmission (TX) coils 1410 and 1420. The RF TX coils 1410 and 1420 are configured to apply an NMRfp RF excitation to a sample. In one example, the at least two individually controllable RF TX coils 1410 and 1420 are configured to apply NMRfp RF excitations in parallel.

Apparatus 1400 includes a heteronuclear NMRfp RF excitation logic 1430 that is configured to control the at least two RE TX coils 1410 and 1420 to produce different NMRfp RF excitations. The different NMRfp excitations may be produced by applying coordinated pairs of series of variable sequence blocks as illustrated in FIGS. 15-19. Recall that different NMRfp RF excitations may be configured to cause different types of nuclei to produce different signal evolutions. Rather than applying the same NMRfp RF excitations from all the available TX coils, apparatus 1400 may apply different excitations from different TX coils. In one example, applying the different excitations may produce a spatial inhomogeneity in a sample.

In one example, the NMRfp RF excitation logic 1430 is configured to make the first NMRfp RF excitation and the second NMRfp RE excitation vary in one or more of, target nuclei, amplitude, phase, frequency, flip angle, and delay time. In another example, the NMRfp RF excitation logic 1430 is configured to control the NMR apparatus 1400 to apply RF energy to the sample in a series of variable sequence blocks that conform to NMRfp constraints. Members of the series may vary both within a coil and between coils.

Apparatus 1400 may include a parallel transmission logic 1440 that is configured to control the NMRfp RF excitation logic 1430 to cause a first individually controllable RF TX coil to apply a first NMRfp RF excitation to the sample and to cause a second individually controllable RF TX coil to apply a second, different NMRfp RF excitation to the sample. In one example, the first and second excitations are selected, coordinated, and configured to produce a spatial inhomogeneity between a first region in the sample and a second region in the sample. The first and second excitations may be selected, coordinated, and configured to make the spatial inhomogeneity sufficient to cause one type of nuclei in the first region to produce a first signal evolution and to cause another type of nuclei in the second region to produce a second signal evolution. This facilitates de-correlating the first signal evolution from the second signal evolution. While two coils and two excitations are described, it is to be appreciated that a greater number of coils and a greater number of excitations may be employed. Additionally, in one embodiment, there may be only a single transmit coil per nuclei. In one embodiment, the two excitations may be produced simultaneously.

Apparatus 1400 may also include an NMR logic 1450 configured to repetitively and variably sample a (k, t, E, n) space associated with the sample to acquire a set of NMR signals. Recall that members of the set of NMR signals are associated with different points in the (k, t, E, n) space, where k is k-space, t is time, E includes at least one NMR parameter, where n is nuclei, and where one or more of, t, and E, vary non-linearly.

Apparatus 1400 may also include a signal logic 1460 configured to produce an NMR signal evolution from the set of NMR signals and a matching logic 1470 configured to compare the produced NMR signal evolution to a known NMR signal evolution.

Apparatus 1400 may also include a de-correlation logic 1480 configured to de-correlate the first signal evolution from the second signal evolution and a characterization logic 1490 configured to characterize one or more types of nuclei in the object based, at least in part, on comparing the produced NMR signal evolution to the known NMR signal evolution or combination of known signal evolutions.

In one example, the characterization logic 1490 may be configured to provide image pixel data suitable for producing a diagnostic image. The image pixel data may be identified from correlations between the produced NMR signal evolution and the known NMR signal evolution and between the known signal evolution and the image pixel data.

In another example, the characterization logic 1490 may be configured to provide NMR parameter data identified from correlations between the produced NMR signal evolution and the known NMR signal evolution or combinations of known signal evolutions and between the known signal evolution and the NMR parameter data.

Conventional HMQC and HSQC use a series of coordinated pulses on multiple nuclei to transfer magnetization from a first nuclei (e.g., $^1H$) to a second nuclei (e.g., X), and then back to the proton after some mixing time. X may be, for example, $^{13}C$. The pulses and thus the transfer may be coordinated with gradients to make it more likely that results associated with only one correlation pathway are visualized at a time. When the gradients are properly designed, timed, and applied, then magnetization will transfer from the first type of nuclei to the second type of nuclei and back. After the transfer, a signal can be received that is a function of just the magnetization that was transferred from the first nuclei to the second nuclei and then back along the quantum correlation pathway.

Figure 15:
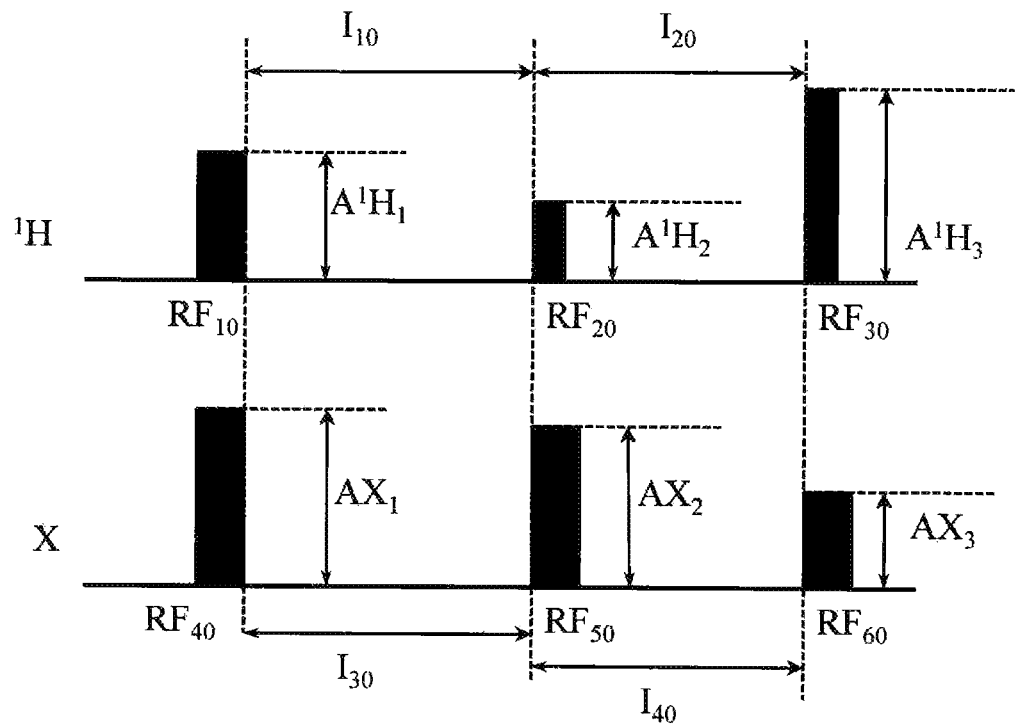
FIG. 15 illustrates an example heteronuclear NMRfp process where RF is applied to two different types of nuclei (e.g., $^1$H, X) using two related pulse sequences that have constant, matched spacing.
Figure 15:

FIG. 15 illustrates pulse sequences associated with one example heteronuclear NMRfp process where RF is applied to excite two different types of nuclei (e.g., $^1H$, X, where X refers to some other element) using constant spacing. In this example, $RF_{10}$ differs from $RF_{40}$ (e.g., amplitude $A^1H_1$=amplitude $AX_1$), $RF_{20}$ differs from $RF_{50}$ (e.g., $A^1H_2$!=$AX_2$), and $RF_{30}$ differs from $RF_{60}$ (e.g., $A^1H_3$!=$AX_3$). The different RF pulses are applied to excite the nuclei at related (e.g., corresponding, parallel, simultaneous) times and the pulses are separated by a constant spacing. $RF_{10}$ is separated from $RF_{20}$ by an interval $I_{10}$ that is similar to (e.g., equals) the interval $I_{30}$ separating $RF_{40}$ from $RF_{50}$. Similarly, $RF_{20}$ is separated from $RF_{30}$ by an interval $I_{20}$ that is similar to (e.g., equal, substantially equal) the interval $I_{40}$ between $RF_{50}$ and $RF_{60}$. While different amplitudes (e.g., magnitudes) are illustrated, different phases may also exist for corresponding RF pulses. One skilled in the art will appreciate that other pulses may be involved.

FIG. 15 illustrates a pulse sequence where subsequent RE pulses are applied to types of nuclei that differ from each other. In one embodiment, the pulses may differ in at least three parameters. The three parameters may include, but are not limited to, magnitude, phase, pulse shape, duration, time at which the pulse is applied, and interval between pulses.

Figure 16:
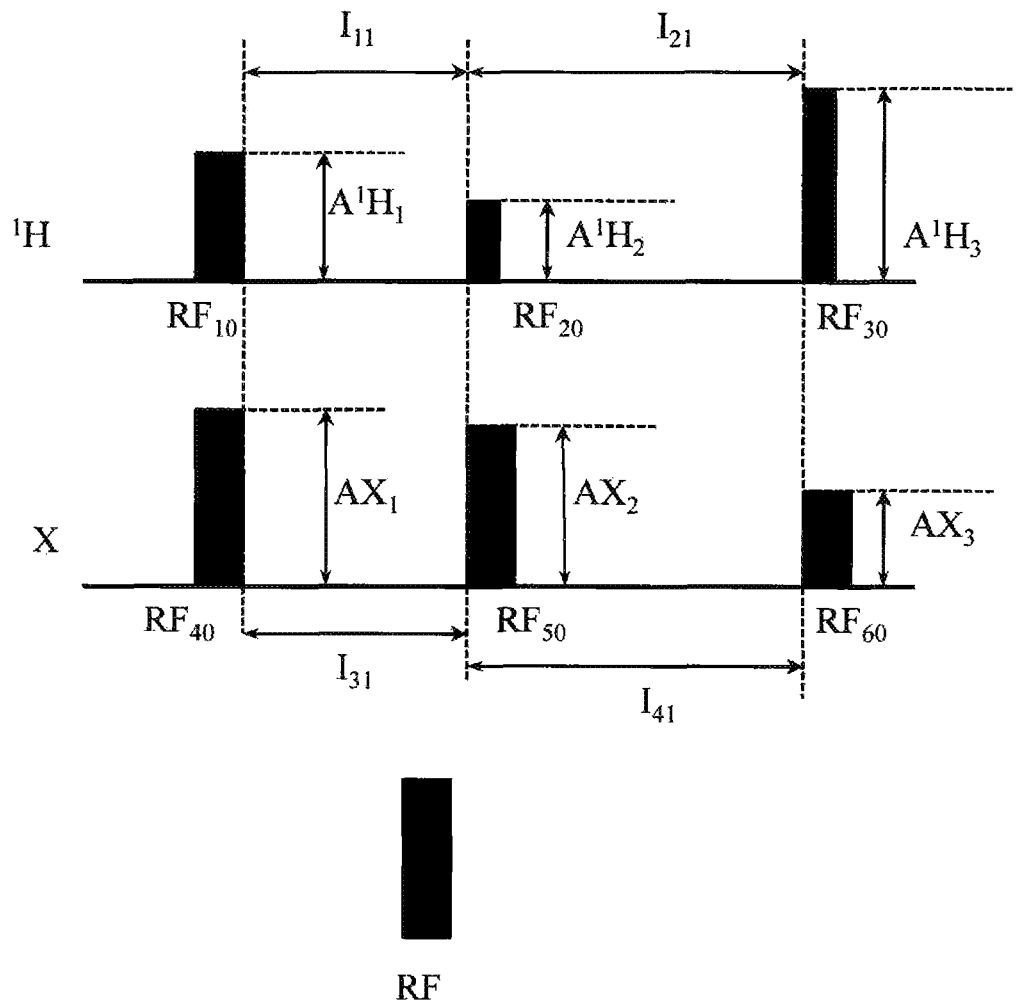
FIG. 16 illustrates an example heteronuclear NMRfp process where RF is applied to two different types of nuclei (e.g., $^1$H, X) using two related pulse sequences having variable, matched spacing.

FIG. 16 illustrates pulse sequences associated with another example heteronuclear NMRfp process where RF is applied to excite two different types of nuclei (e.g., $^1H$, X) using variable, matched spacing. In this example, $RF_{10}$ differs from $RF_{40}$ (e.g., $A^1H_1$!=$AX_1$), $RF_{20}$ differs from $RF_{50}$ (e.g., $A^1H_2$!=$AX_2$), and $RF_{30}$ differs from $RF_{60}$ (e.g., $A^1H_3$!=$AX_3$). The different RF pulses are applied to the two species at corresponding times, but the pulses are separated within their own series by variable spacing. $RF_{10}$ is separated from $RF_{20}$ by an interval that differs from the interval $I_{21}$ separating $RF_{20}$ from $RF_{30}$. Similarly, $RF_{40}$ is separated from $RF_{50}$ by an interval $I_{31}$ that differs from the interval $I_{41}$ between $RF_{50}$ and $RF_{60}$. While different amplitudes (e.g., magnitudes) are illustrated, different phases may also exist for corresponding RE pulses. This type of spacing between the pulses could be altered to change the form of the coherence transfer. This may be useful for X nuclei that have large frequency spacings (e.g., $^{13}C$).

FIG. 16 illustrates a pulse sequence where subsequent RF pulses are applied to types of nuclei that differ from each other. In one embodiment, the pulses may differ in at least three parameters. The three parameters may include, but are not limited to, magnitude, phase, pulse shape, duration, time at which the pulse is applied, and interval between pulses.

Figure 17:
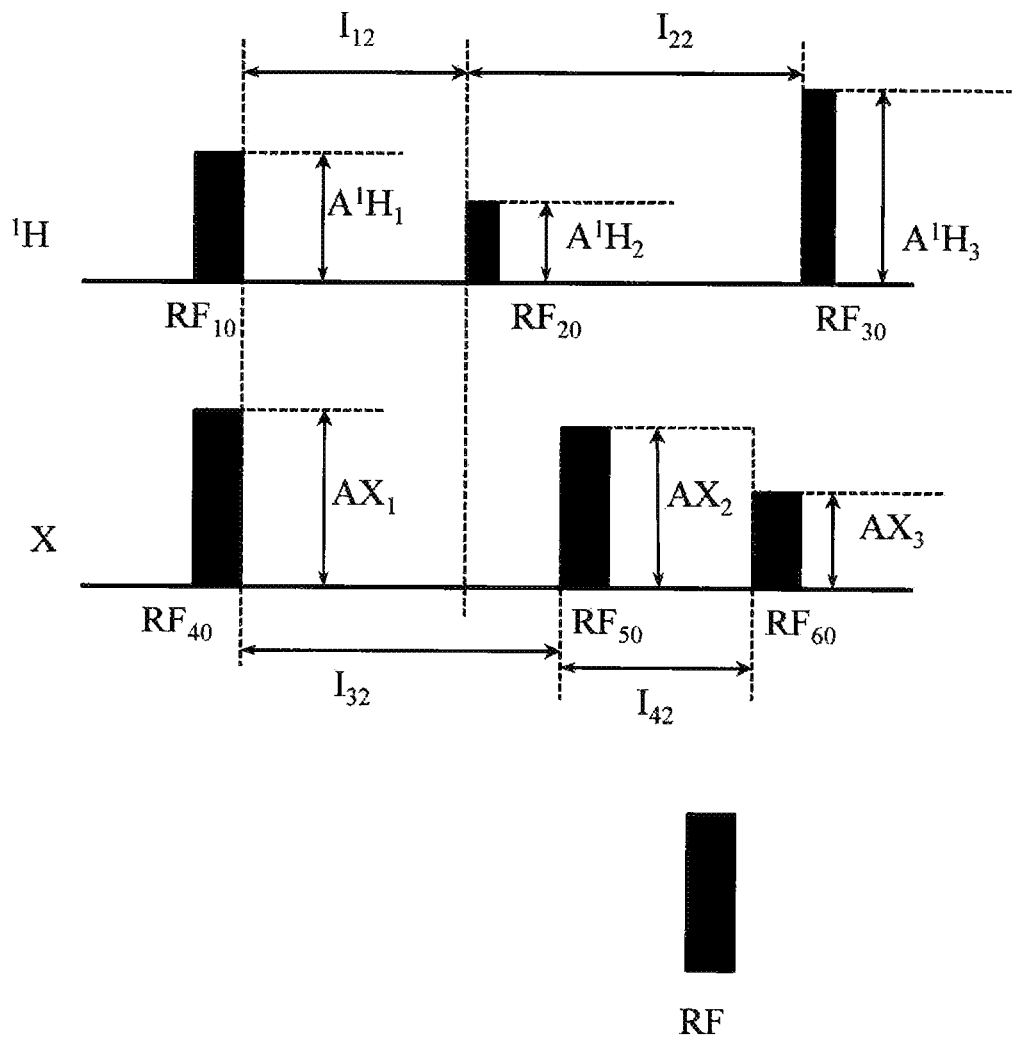
FIG. 17 illustrates an example heteronuclear NMRfp process where RF is applied to two different types of nuclei (e.g., $^1$H, X) using two related pulse sequences having variable, mismatched spacing.

FIG. 17 illustrates another example heteronuclear NMRfp process where RF is applied to two different types of nuclei (e.g., $^1H$, X) using variable, mismatched spacing. In this example, $RF_{10}$ differs from $RF_{40}$ (e.g., $A^1H_1$!=$AX_1$), $RF_{20}$ differs from $RF_{50}$ (e.g., $A^1H_2$!=$AX_2$), and $RF_{30}$ differs from $RF_{60}$ (e.g., $A^1H_3$!=$AX_3$). The different RE pulses are applied to the two types of nuclei at different times, and the pulses in a series for a single type of nuclei are separated within their own series by variable spacing. $RF_{10}$ is separated from $RF_{20}$ by an interval $I_{12}$ that differs from the interval $I_{32}$ separating $RF_{40}$ from $RF_{50}$ and that differs from the interval $I_{22}$ separating $RF_{20}$ from $RF_{30}$. Similarly, $RF_{20}$ is separated from $RF_{30}$ by an interval $I_{22}$ that differs from the interval $I_{42}$ between $RF_{50}$ and $RF_{60}$. While different amplitudes (e.g., magnitudes) are illustrated, different phases may also exist for corresponding RF pulses. Thus, FIG. 17 illustrates changes in magnitude, phase, and spacing of RF pulses separately between different nuclei. This type of spacing between the pulses and differences between spacings between species could be altered to change the form of the coherence transfer.

FIG. 17 illustrates a pulse sequence where subsequent RF pulses are applied to types of nuclei that differ from each other. In one embodiment, the pulses may differ in at least three parameters. The three parameters may include, but are not limited to, magnitude, phase, pulse shape, duration, time at which the pulse is applied, and interval between pulses.

Figure 18:
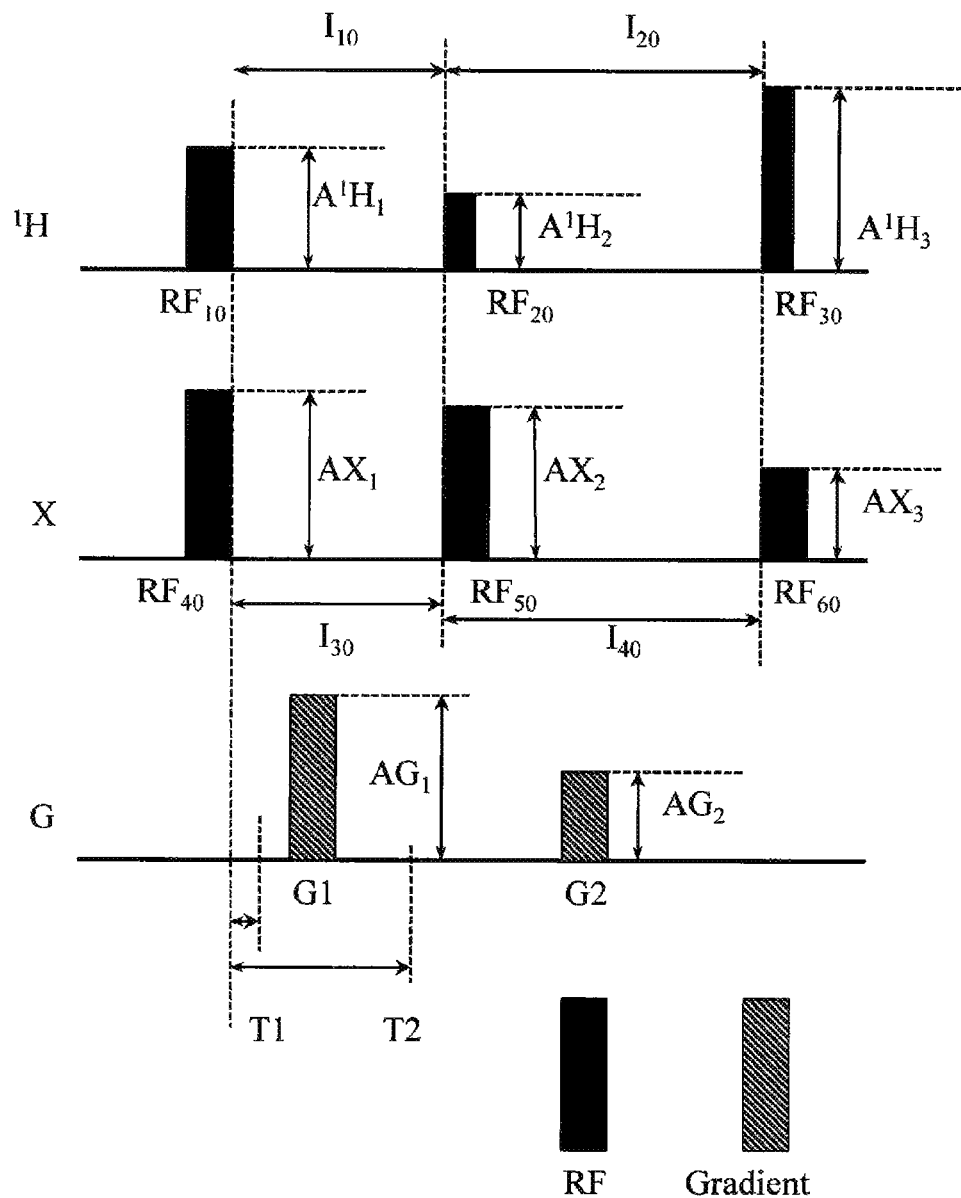
FIG. 18 illustrates an example heteronuclear NMRfp process where RF is applied to two different types of nuclei (e.g., $^1$H, X) using two related pulse sequences having variable, matched spacing and where gradients are also applied.

FIG. 18 illustrates an example heteronuclear NMRfp process where RF is applied to two different types of nuclei (e.g., $^1H$, X) using two coordinated series of variable sequence blocks having variable, matched spacing. In this example, gradients are also applied. For example a first gradient $G_1$ may be applied during interval $I_{10}$ and a second gradient $G_2$ may be applied during interval $I_{20}$. The gradients cause the acquired signal to be a function of magnetization that was transferred from $^1H$ to X and then back along a quantum correlation path between $^1H$ and X. The gradients may have varying spacing, strength, and form. For example, $G_1$ may have a first amplitude $AG_1$ that does not equal the amplitude $AG_2$ of gradient $G_2$. In different examples, the gradients may have arbitrary or random spacings. By way of illustration, gradient G1 may be applied at first time, which is closer to $RF_{10}$ or may be applied at a second time T2, which is closer to $RF_{20}$. As a pulse sequence progresses, gradients may be presented at varying times.

FIG. 18 illustrates a pulse sequence where subsequent RF pulses are applied to nuclei that differ from each other. In one embodiment, the pulses may differ in at least three parameters. The three parameters may include, but are not limited to, magnitude, phase, pulse shape, duration, time at which the pulse is applied, and interval between pulses.

Figure 19:
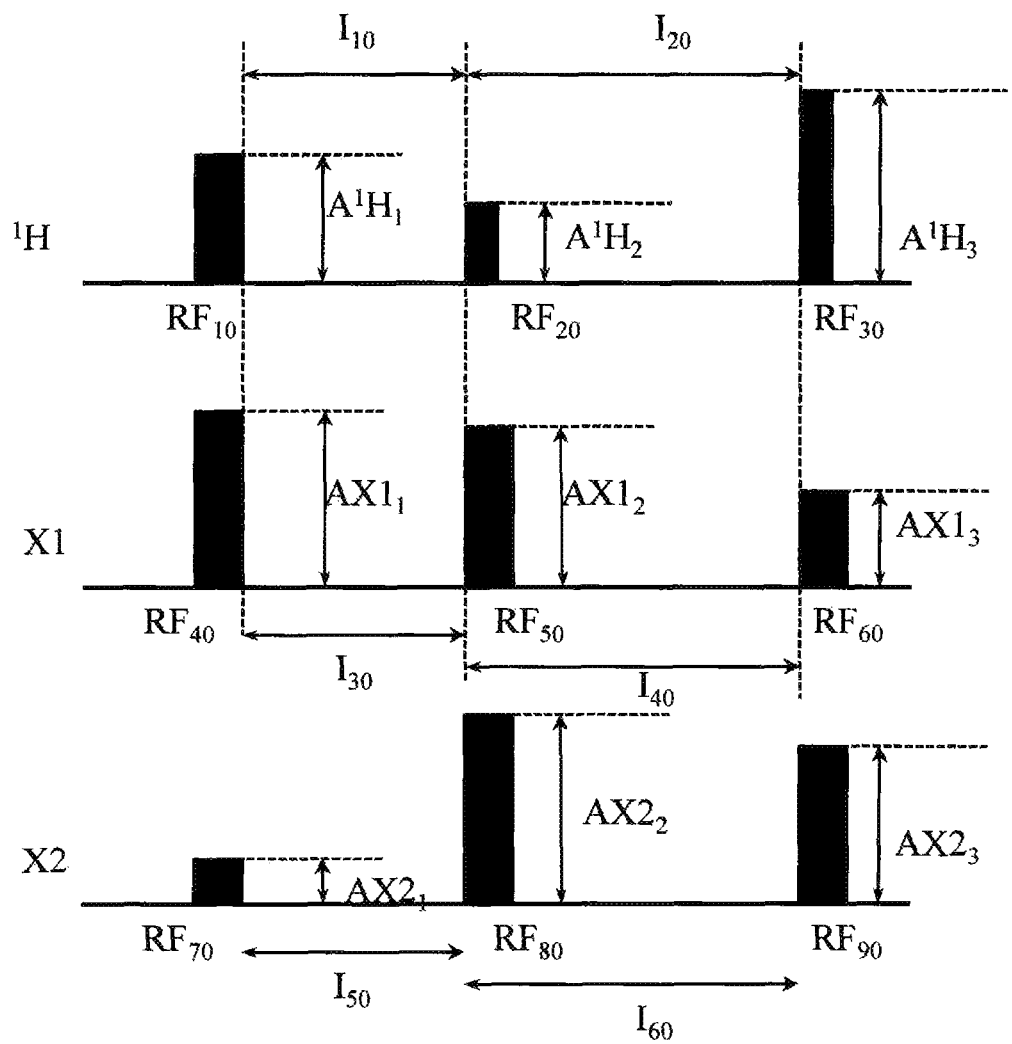
FIG. 19 illustrates an example heteronuclear process where RE is applied to three different types of nuclei using variable, matched spacing.
Figure 19:

FIG. 19 illustrates pulse sequences associated with an example heteronuclear process where RF is applied to excite three different types of nuclei (e.g., $^1H$, $X_1$, $X_2$) using three coordinated series of variable sequence blocks having variable, matched spacing. In this example, $RF_{10}$ differs from $RF_{40}$ and both differ from $RF_{70}$ (e.g., $A^1H_1!=AX1_1!=AX2_1$), $RF_{20}$ differs from $RF_{50}$ and bother differ from $RF_{80}$ (e.g., $A^1H_2!=AX1_2!=AX2_2$), and $RF_{30}$ differs from $RF_{60}$ and both differ from $RF_{90}$ (e.g., $A^1H_3!=AX1_3!=AX2_3$). The different RF pulses are applied to excite the three types of nuclei at corresponding times, but the pulses are separated by variable spacing. $RF_{10}$ is separated from $RF_{20}$ by an interval $I_{10}$ that differs from the interval $I_{20}$ separating $RF_{20}$ from $RF_{30}$. In one example, interval $I_{50}$ matches interval $I_{10}$ and interval $I_{60}$ matches Interval $I_{20}$. Other different spacings are also illustrated. While different amplitudes (e.g., magnitudes) are illustrated, different phases may also exist for corresponding RF pulses. This type of spacing between the pulses could be altered to change the form of the coherence transfer. This example process may be useful for some sets of different types of nuclei including, but not limited to, ($^1H$, $^{17}O$, $^{31}P$) and ($^1H$, $^{23}Na$, $^{31}P$). By way of illustration, ($^1H$, $^{17}O$, $^{31}P$) may be useful for analyzing mitochondrial function and ($^1H$, $^{23}Na$, $^{31}P$) may be useful for analyzing other metabolic processes.

FIG. 19 illustrates a pulse sequence where subsequent RF pulses are applied to types of nuclei that differ from each other. In one embodiment, the pulses may differ in at least three parameters. The three parameters may include, but are not limited to, target nuclei, magnitude, phase, pulse shape, duration, time at which the pulse is applied, and interval between pulses.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and other devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it is intended to convey the set of possibilities A, B, C, AB, AC, BC, or ABC (e.g., the data store may store only A, only B, only C, A&B, A&C, B&C, or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it is intended to convey the set of possibilities A, B, C, AB, AC, BC, ABC, AA . . . A, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method of controlling a nuclear magnetic resonance (NMR) apparatus, comprising:
controlling the NMR apparatus using a computer in order to apply radio frequency (RF) energy into a volume in an object,
where the RF energy being applied is applied in a coordinated series of two or more variable sequence blocks,
where a variable sequence block of applied RF energy includes one or more excitation phases, one or more readout phases, and one or more waiting phases,
where at least one sequence block in the coordinated series of two or more variable sequence blocks differs from at least one other variable sequence block in the coordinated series of two or more variable sequence blocks, in at least N sequence block parameters, with N being an integer greater than one, and where the sequence block parameters may comprise:
relaxation time, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling;
where a first member of the coordinated series of two or more variable sequence blocks is configured to cause a first nuclei type in the volume of the object to produce a first NMR signal, and
where a second member of the coordinated series of two or more variable sequence blocks is configured to cause a second different nuclei type in the volume of the object to produce a second NMR signal;
controlling the NMR apparatus using the computer in order to acquire a signal evolution from the volume of the object, where the acquired signal evolution is a function of NMR excitation produced by applying the RF energy in the coordinated series of two or more variable sequence blocks;
comparing, using the computer, the acquired signal evolution to one or more of, a reference signal evolution, and a combination of reference signal evolutions in order to generate at least one image of the object that provides a heteronuclear NMR fingerprinting quantitative characterization of the volume of the object based on the nuclei present in the volume of the object; and
displaying the at least one generated image of the object that provides the heteronuclear NMR fingerprinting quantitative characterization of the volume of the object on a display that Is in communication with the computer.

2. The method of claim 1, where the RF energy is configured to cause a transfer of magnetization between the first nuclei type and the second nuclei type in accordance with a quantum correlation pathway.

3. The method of claim 2, where the first nuclei type is 1H and where the second nuclei type is one of 13C, 14N, 15N, 31P, and 17O.

4. The method of claim 2, where the first nuclei type is 13C and where the second nuclei type is one of 14N and 31P.

5. The method of claim 1, where the N sequence block parameters comprise three or more of: echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

6. The method of claim 1, comprising:
controlling the NMR apparatus with the computer in order to vary one or more of, the amount of time between sequence blocks, the relative amplitude of RF pulses in sequence blocks, and the relative phase of RF pulses in sequence blocks.

7. The method of claim 1, comprising:
controlling the NMR apparatus with the computer in order to apply the RF energy according to a partially random acquisition plan configured to under-sample the object at an under-sampling rate R.

8. The method of claim 1, where the reference signal evolutions include signals outside the set of signal evolutions characterized by the equation of:

$$SE = A - Be^{-t/C}$$

where:
SE is a signal evolution,
A is a constant,
B is a constant,
T is time, and
C is a single relaxation parameter.

9. The method of claim 1, where the reference signal evolutions include a signal evolution selected from a set of signal evolutions described by one of:

$$SE = \sum_{i=1}^{N_A} \sum_{j=1}^{N_{RF}} R_i(\alpha) R_{RF_{ij}}(\alpha, \phi) R(G) E_i(T1, T2, D, f, \ldots)$$

and $$SE = \sum_{i=1}^{N_A} \sum_{j=1}^{N_{RF}} R_i(\alpha) R_{RF_{ij}}(\alpha, \phi) R(G) E_i(T1, T2, f, \ldots)$$

where:
SE is a signal evolution,
$N_A$ is a number of sequence blocks,
$N_{RF}$ is a number of RF pulses in a sequence block,
α is a flip angle,
Φ is a phase angle,
$R_i(\alpha)$ is a rotation due to off resonance,
$R_{RF_{ij}}(\alpha, \Phi)$ is a rotation due to RF differences,
R(G) is a rotation due to a gradient,
T1 is a spin-lattice relaxation,
T2 is a spin-spin relaxation,
D is diffusion relaxation, and
$E_i(T1, T2, D, f, \ldots)$ is signal change per sequence block.

10. The method of claim 1, where signal content of the signal evolution varies directly with N.

11. The method of claim 1, comprising:
controlling the NMR apparatus using the computer in order to selectively apply a first set of the two or more variable sequence blocks selected from the coordinated series of variable sequence blocks from a first of two or more TX coils arranged in a parallel transmission array that is available to the NMR apparatus;
controlling the NMR apparatus using the computer in order to selectively apply a second set of the two or more sequence blocks selected from the coordinated series of variable sequence blocks from a second of the two or more TX coils; and
controlling the NMR apparatus using the computer in order to acquire individual NMR signal evolutions simultaneously produced in response to the applying of the first set and the second set of the two or more variable sequence blocks selected from the coordinated series of variable sequence blocks.

12. The method of claim 11, whereby the computer is programmed to select the first set and the second set of the two or more variable sequence blocks selected from the coordinated series of variable sequence blocks, so that member variables of the sets differ in one or more of, amplitude, phase, frequency, delay, and flip angle.

13. The method of claim 11, whereby the computer is programmed to select the first set and the second set of the two or more variable sequence blocks selected from the coordinated series of variable sequence blocks, so that member variables differ in an amount effective to change contrast in the sample from sequence block to sequence block, and from location to location.

14. The method of claim 11, where the first set and the second set of the two or more variable sequence blocks selected from the coordinated series of variable sequence blocks, are configured to produce a spatial inhomogeneity in the sample when the first set and the second set of the two or more variable sequence blocks are applied, with the spatial inhomogeneity being a flip angle or excitation phase distribution.

15. A nuclear magnetic resonance (NMR) apparatus, that performs heteronuclear nuclear magnetic resonance (NMR) fingerprinting, comprising:
a computer coupled to control the NMR apparatus and programmed in order to:
repetitively and variably sample a (k, t, E, n) space associated with an object in order to acquire a set of NMR signals associated with two or more types of nuclei in the sample, where members of the set of NMR signals are associated with different points in the (k, t, E, n) space, where k is frequency space, t is time, where E includes at least one NMR parameter, and where n is nuclei, whereby the at least one NMR parameter represented by E may comprise a parameter selected from:
relaxation time, echo time, flip angle, phase encoding, diffusion encoding, flow encoding, radio frequency (RF) pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling;
produce an NMR fingerprinting signal evolution from, the acquired set of NMR signals;
compare the produced NMR fingerprinting signal evolution to a known referential NMR fingerprinting signal evolution or combinations of NMR fingerprinting signal evolutions, from a library, look-up-table, or database of NMR signal evolutions;
based on comparing the produced NMR fingerprinting signal evolution to a known NMR fingerprinting signal evolution or combinations of fingerprinting signal evolutions, produce an Image of the object showing a quantitative characterization of the object based on the two or more types of nuclei that are present in the object; and
a display in communication with the computer in order to receive and display the image of the object providing the quantitative characterization of the object.

16. The apparatus of claim 15, comprising:
two or more individually controllable radio frequency (RF) transmission (TX) coils configured to apply NMR fingerprinting ($NMR_{fp}$) RF excitations to the sample in parallel;
where the computer is further programmed in order to:
control members of the two or more RF TX coils in order to produce $NMR_{fp}$ RF excitations, where an individual $NMR_{fp}$ RF excitation is configured in order to cause the two or more types of nuclei in the sample to produce different signal evolutions;
cause a first member of the two or more individually controllable RF TX coils to apply a first $NMR_{fp}$ RF excitation to the sample and to cause a second member of the two or more individually controllable RF TX coils in order to apply a second, different $NMR_{fp}$ RF excitation to the sample,
where the first $NMR_{fp}$ RF excitation and the second $NMR_{fp}$ RF excitation are configured to produce a spatial inhomogeneity between a first region in the sample and a second region in the sample, and where the spatial inhomogeneity is sufficient enough to cause nuclei in the first region to produce a first signal evolution and is also sufficient enough to cause nuclei in the second region to produce a second signal evolution, where the first signal evolution is orthogonal to the second signal evolution by more than a previously determined threshold amount.

17. The NMR apparatus of claim 15, where the computer is further programmed in order to apply RF excitation according to a variable series of sequence blocks designed to cause a transfer of magnetization between a first nuclei type and a second nuclei type, where there is a quantum correlation pathway between the first nuclei type and the second nuclei, type, and where the transfer of magnetization occurs along the quantum correlation pathway.

18. The NMR apparatus of claim 17, where at least one member of the variable series of sequence blocks differs from at least one other member of the variable series of sequence blocks in at least, one of: the number of $\alpha 2$ pulses in a sequence block, the spacing of $\alpha 2$ pulses in a sequence block, the phase of $\alpha 2$ pulses in a sequence block, and the amplitude of $\alpha 2$ pulses in a sequence block.

19. A non-transitory computer-readable medium storing computer executable instructions that, when executed by a computer, control the computer to perform a heteronuclear nuclear magnetic resonance (NMR) fingerprinting method with an NMR apparatus, the heteronuclear NMR fingerprinting method comprising:

controlling, with a computer coupled to the NMR apparatus, the NMR apparatus in order to apply radio frequency (RF) energy that is suitable to produce concurrent nuclear magnetic resonance in two or more different types of nuclei that are present in a volume, where the two or more different types of nuclei share a quantum correlation with one another, and where the NMR apparatus is also controlled by the computer in order to apply the RF energy in at least two different sequence blocks that differ in at least two or more of,
the number of $\alpha 2$ pulses,
the amplitude of $\alpha 2$ pulses,
the phase of $\alpha 2$ pulses, and
the spacing between $\alpha 2$ pulses
into the volume and acquire NMR signals therefrom;

determining, using the computer, two or more NMR parameters of the two or more different types of nuclei by pattern matching NMR signals acquired from the volume in order to reference signal evolutions or combinations of signal evolutions from a library, look-up table, or database of NMR signal evolutions, wherein the two or more NMR parameter may include relaxation time, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling;

using the computer, producing a heteronuclear NMR fingerprinting image based on the acquired NMR signals and the determinings of the two or more NMR parameters; and displaying the heteronuclear NMR fingerprinting image on a display in communication with the computer.

* * * * *

UNITED STATES PATENT AND TRADEMARK OFFICE
CERTIFICATE OF CORRECTION

PATENT NO. : 9,869,739 B2
APPLICATION NO. : 13/651690
DATED : January 16, 2018
INVENTOR(S) : Mark Griswold It is certified that error appears in the above-identified patent and that said Letters Patent is hereby corrected as shown below:

In the Specification

Column 3, Line 10, "$^{14}N$, & $^{15}N$" should be --$^{14}N$, $^{1}H$ & $^{15}N$--.

Column 6, Line 31, "RE" should be --RF--.

Column 9, Line 22, "RE" should be --RF--.

Column 9, Line 44, "RE" should be --RF--.

Column 9, Line 52, "RE" should be --RF--.

Column 14, Line 35, "RE" should be --RF--.

Column 14, Line 48, "RE" should be --RF--.

Column 16, Line 8, "RE" should be --RF--.

Column 16, Line 27, "RE" should be --RF--.

Column 16, Line 41, "RE" should be --RF--.

Column 19, Lines 11-12, "A, CC" should be --A, BB . . . B, CC--.

Signed and Sealed this
Third Day of July, 2018

Andrei Iancu
*Director of the United States Patent and Trademark Office*